(12) United States Patent
Yanagidaira

(10) Patent No.: US 10,121,549 B2
(45) Date of Patent: Nov. 6, 2018

(54) SEMICONDUCTOR MEMORY DEVICE

(71) Applicant: Toshiba Memory Corporation, Tokyo (JP)

(72) Inventor: Kosuke Yanagidaira, Kanagawa (JP)

(73) Assignee: TOSHIBA MEMORY CORPORATION, Tokyo (JP)

( * ) Notice: Subject to any disclaimer, the term of this patent is extended or adjusted under 35 U.S.C. 154(b) by 0 days.

(21) Appl. No.: 15/442,684

(22) Filed: Feb. 26, 2017

(65) Prior Publication Data
US 2018/0053556 A1  Feb. 22, 2018

(30) Foreign Application Priority Data

Aug. 19, 2016  (JP) .................................. 2016-161061

(51) Int. Cl.
G11C 16/26 (2006.01)
G11C 16/10 (2006.01)
G11C 7/04 (2006.01)

(52) U.S. Cl.
CPC ............... *G11C 16/26* (2013.01); *G11C 7/04* (2013.01); *G11C 16/10* (2013.01)

(58) Field of Classification Search
CPC .................. G11C 2207/2254; G11C 29/022
USPC ....................................................... 365/211
See application file for complete search history.

(56) References Cited

U.S. PATENT DOCUMENTS

| 9,361,985 | B2 | 6/2016 | Kim et al. |
| 2008/0304336 | A1 | 12/2008 | Kim et al. |
| 2010/0308861 | A1 | 12/2010 | Lee |
| 2015/0067292 | A1 | 3/2015 | Grunzke |
| 2015/0171863 | A1 | 6/2015 | Ha |
| 2016/0357454 | A1* | 12/2016 | Lee ...................... G06F 3/0611 |
| 2017/0154668 | A1* | 6/2017 | Ha ...................... G11C 11/4094 |

OTHER PUBLICATIONS

Office Action dated Mar. 27, 2018 in corresponding Taiwanese Patent Application No. 106104801 with English translation, 6 pages.

* cited by examiner

*Primary Examiner* — Hoai V Ho
*Assistant Examiner* — Minh Dinh
(74) *Attorney, Agent, or Firm* — Patterson & Sheridan, LLP

(57) ABSTRACT

A semiconductor memory device includes a first circuit configured to process data received from and transmitted to an external controller, a second circuit configured to execute calibration on the first circuit, and a control circuit configured to control the second circuit to execute the calibration on the first circuit in response to a calibration command received from the external controller. In response to a first calibration command, the control circuit controls the second circuit to execute the calibration on the first circuit. In response to a second calibration command that is received after the first calibration command, the control circuit controls the second circuit to execute the calibration on the first circuit if a first condition is met and to not execute the calibration on the first circuit if the first condition is not met.

18 Claims, 17 Drawing Sheets

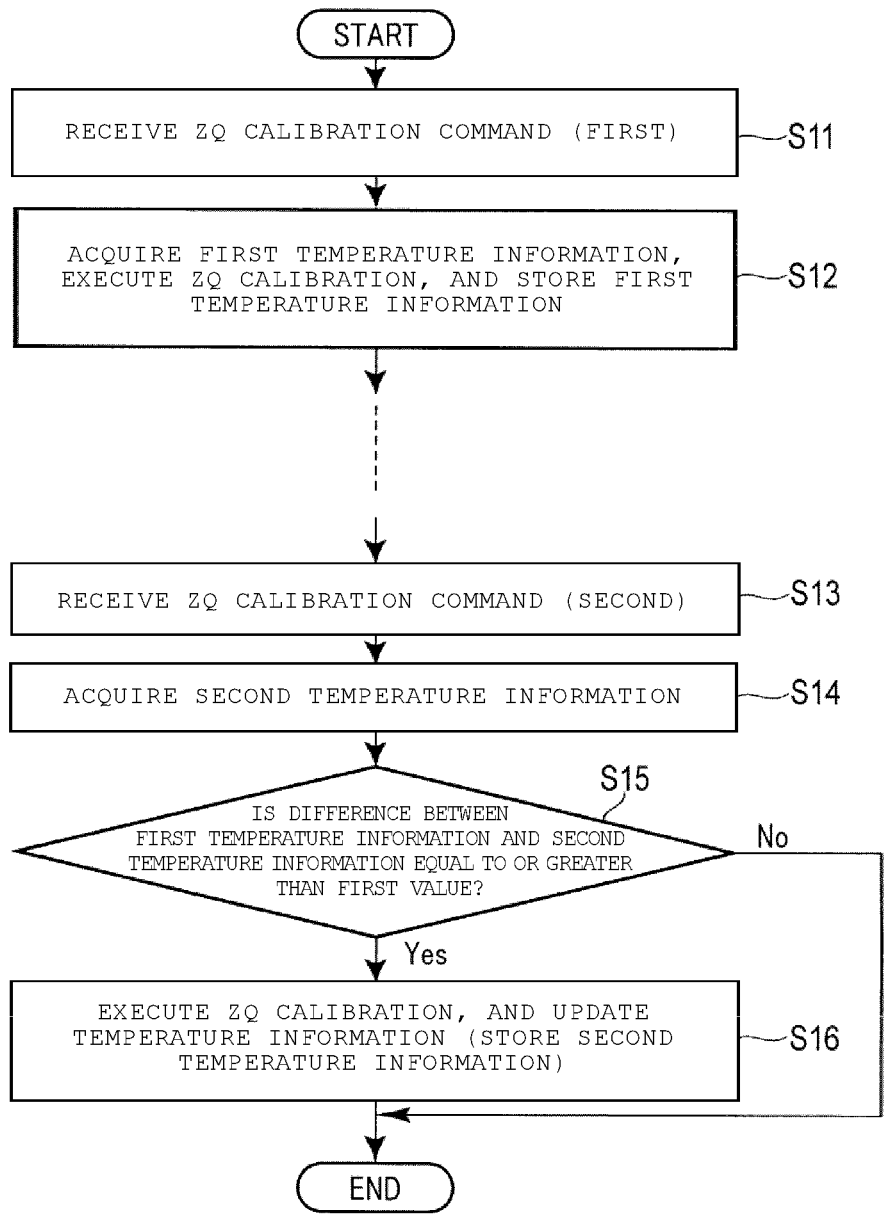

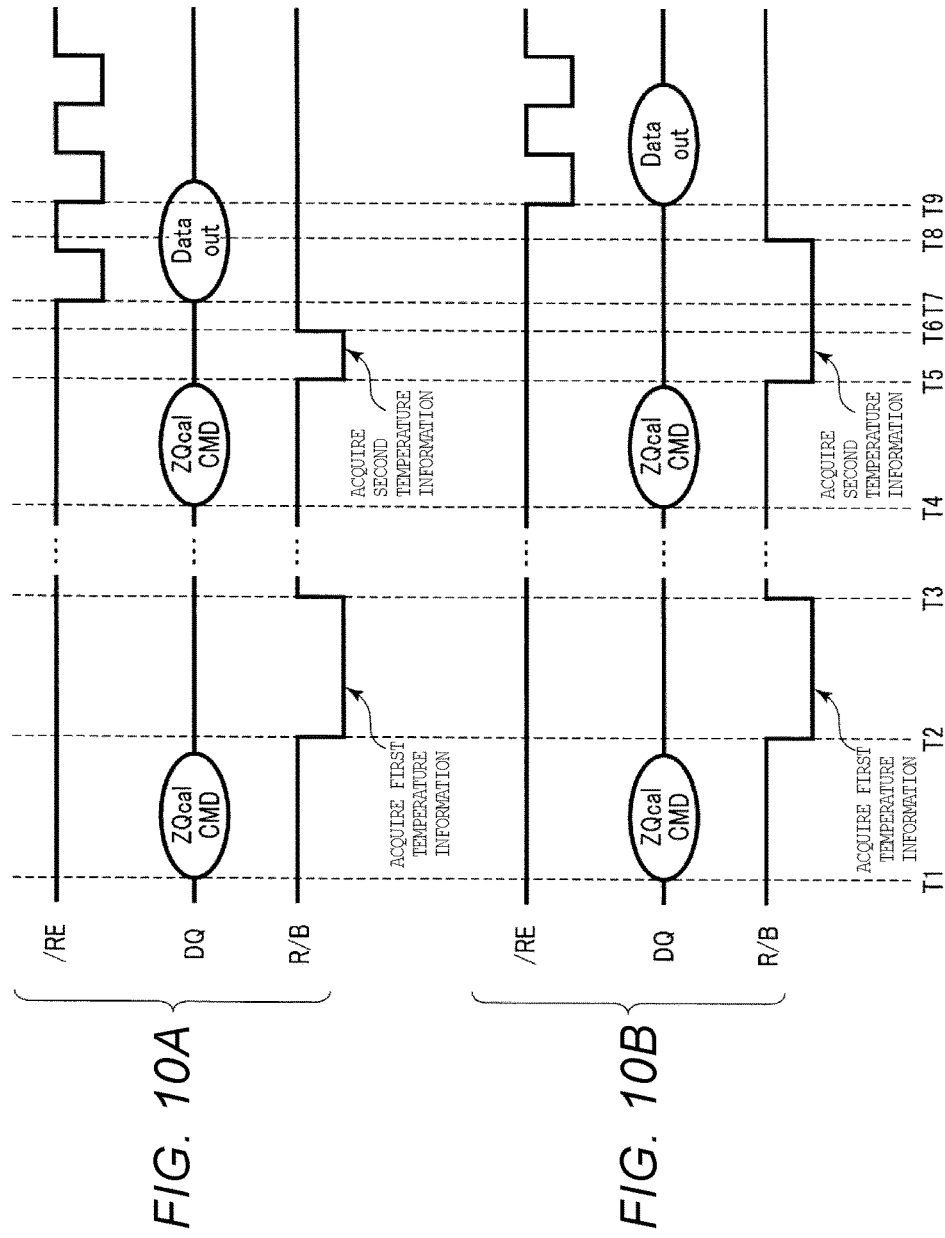

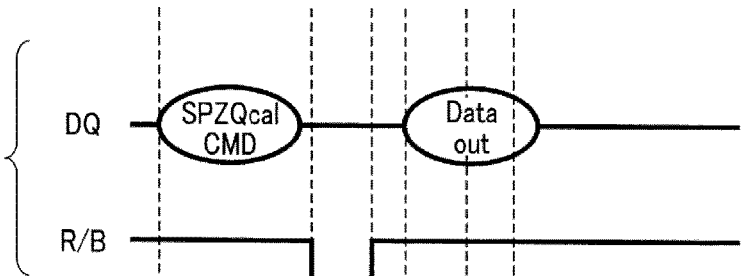
FIG. 11A
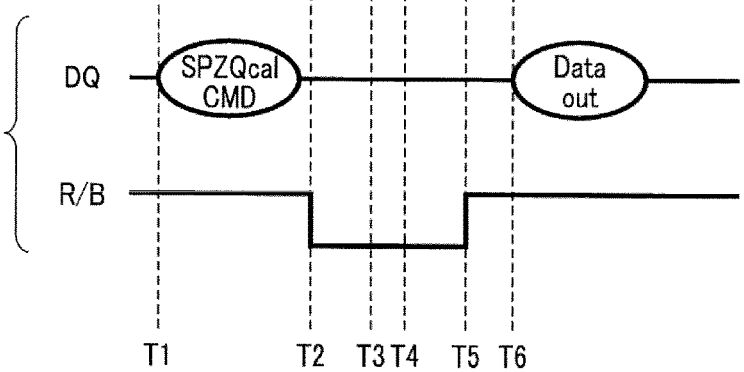
FIG. 11B
FIG. 12
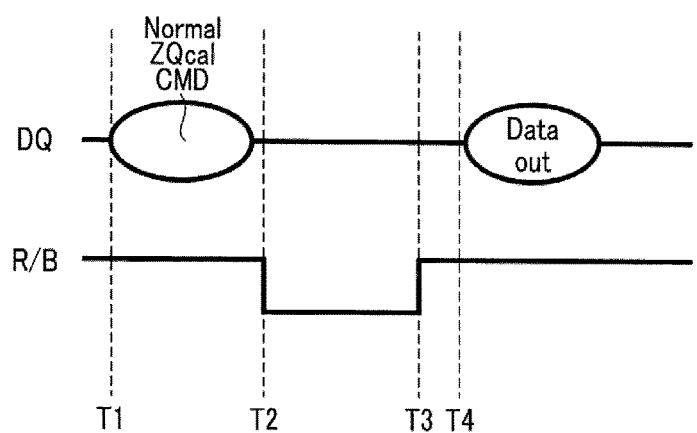

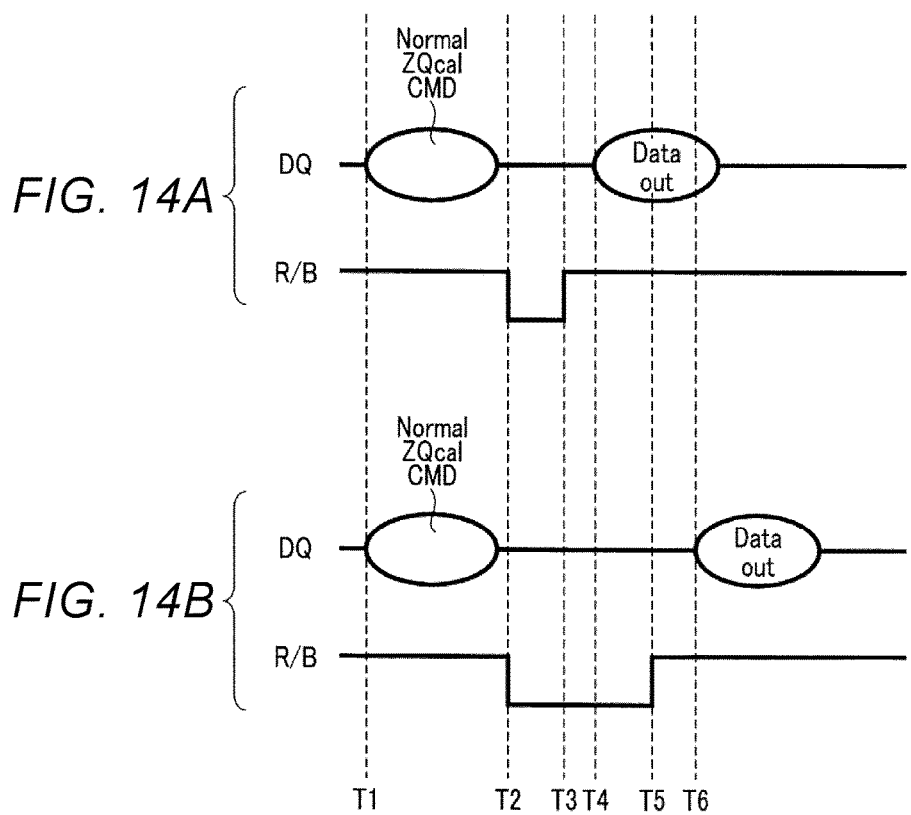
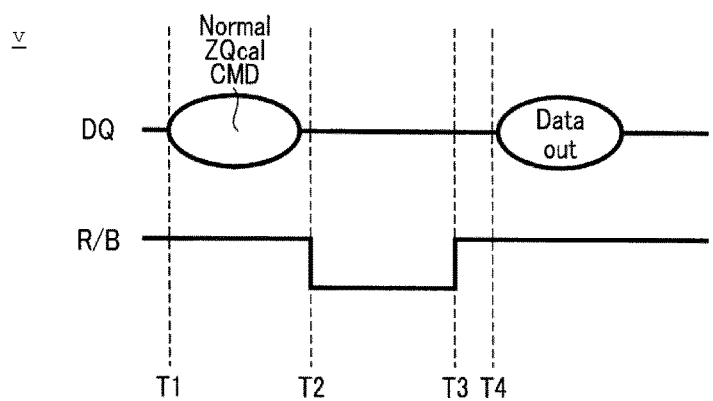

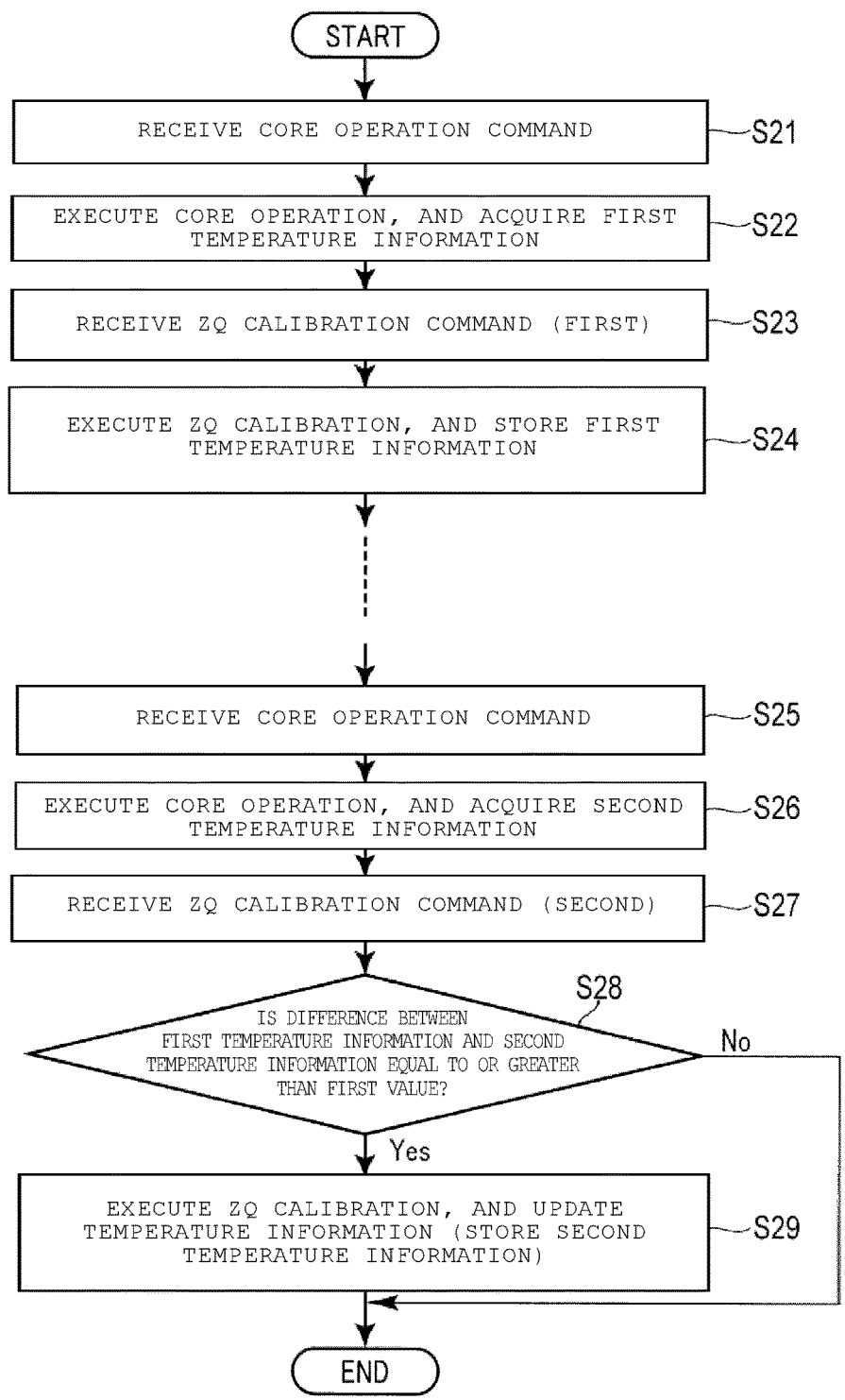

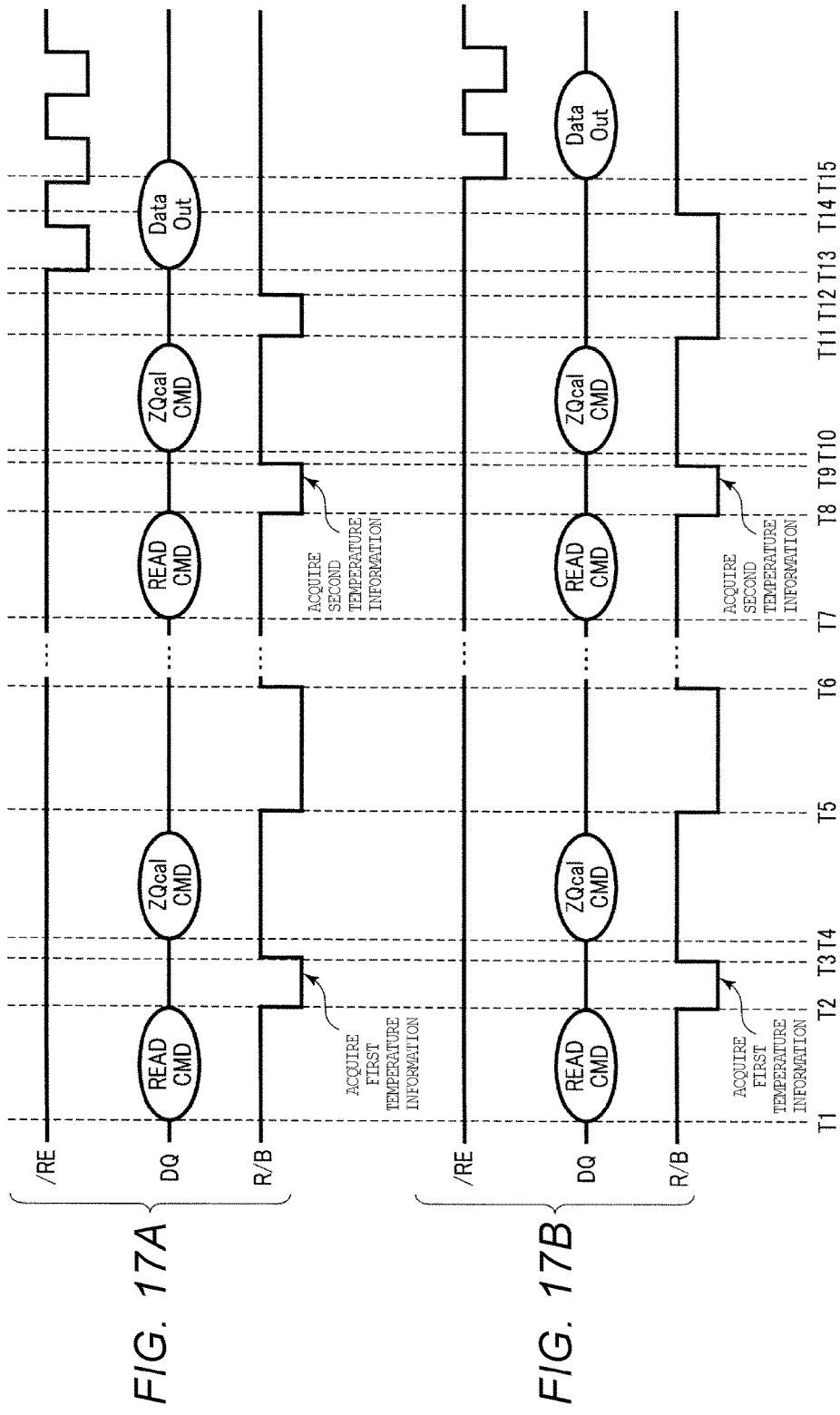

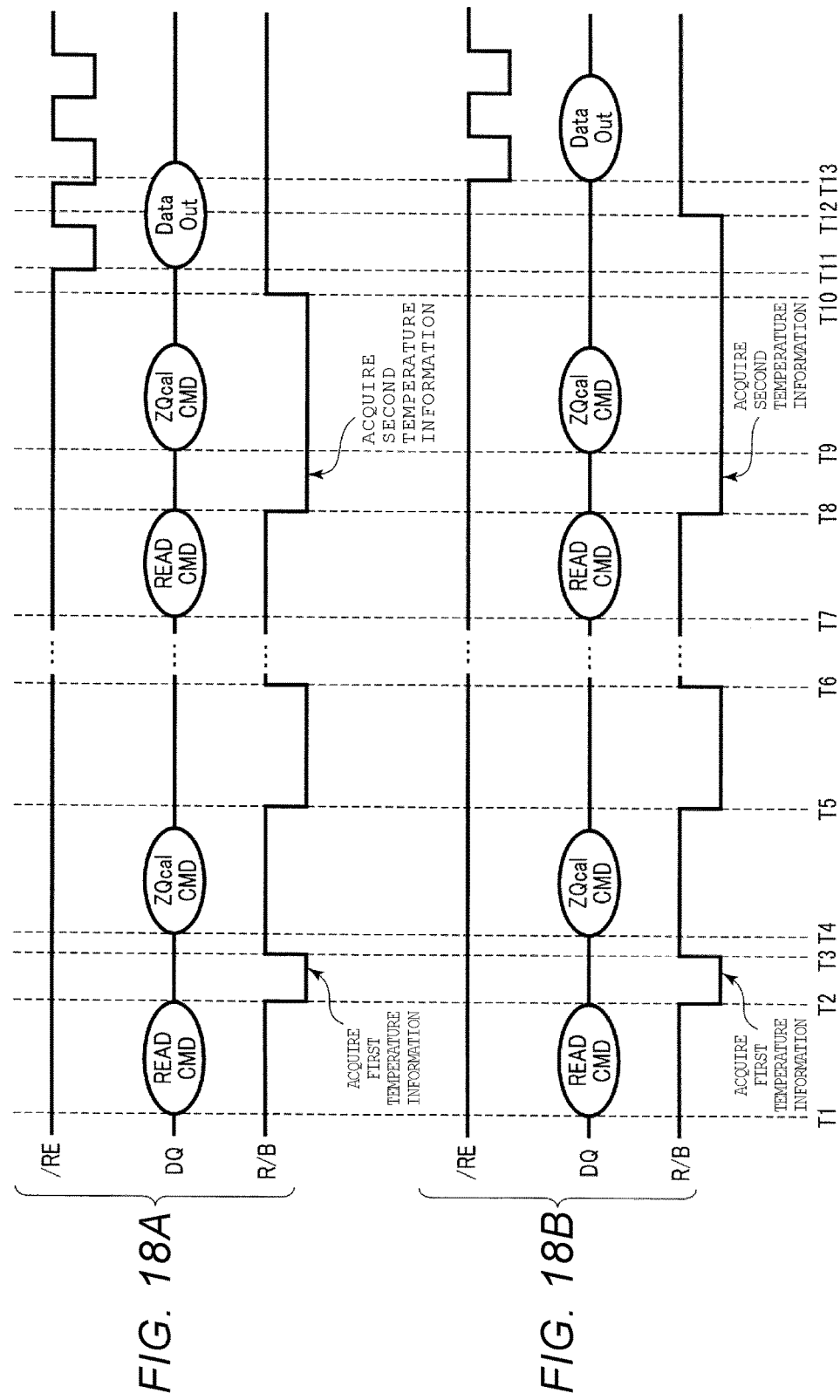

SEMICONDUCTOR MEMORY DEVICE

CROSS-REFERENCE TO RELATED APPLICATION

This application is based upon and claims the benefit of priority from Japanese Patent Application No. 2016-161061, filed Aug. 19, 2016, the entire contents of which are incorporated herein by reference.

FIELD

Embodiments described herein relate generally to a semiconductor memory device.

BACKGROUND

The characteristics of a data input/output buffer in a semiconductor memory device vary in accordance with changes in a process voltage temperature (PVT). When the characteristics are out of proper range, high-speed data transfer becomes difficult. For this reason, there is a need to bring the characteristics of the input/output circuit back into the appropriate range by correcting for the changes in the characteristics of the input/output circuit.

According to one method, a zero quotient (ZQ) calibration function has been proposed. The ZQ calibration is a method that dynamically corrects the impedance of the signal line of the input/output circuit using a termination resistor connected to the signal line of the input/output circuit.

However, during the ZQ calibration, the input/output circuit cannot be used. For this reason, when the ZQ calibration is frequently executed, the data transfer by the input/output circuit cannot be executed, and thus the data transfer is limited.

DESCRIPTION OF THE DRAWINGS

FIG. 9 is a flowchart illustrating a ZQ calibration sequence executed in the semiconductor memory device according to the first embodiment.

FIGS. 10A and 10B are timing charts illustrating specific examples of the various signals produced during the ZQ calibration sequence of FIG. 9.

FIGS. 11A-11B and 12 are diagrams illustrating first examples of a command sequence for a ZQ calibration sequence to be executed in the semiconductor memory device according to the first embodiment.

FIGS. 14A-14B and 15 are diagrams illustrating the second examples of a command sequence for a ZQ calibration sequence to be executed in the semiconductor memory device according to the first embodiment.

FIG. 16 is a flowchart illustrating a ZQ calibration sequence executed in the semiconductor memory device according to a second embodiment.

FIGS. 17A and 17B are timing charts illustrating specific examples of the various signals produced during the ZQ calibration sequence of FIG. 16.

FIGS. 18A and 18B are timing charts illustrating specific examples of the various signals produced during the ZQ calibration sequence that has been modified from the example of FIG. 17A and the example of FIG. 17B, respectively.

DETAILED DESCRIPTION

Figure 1:
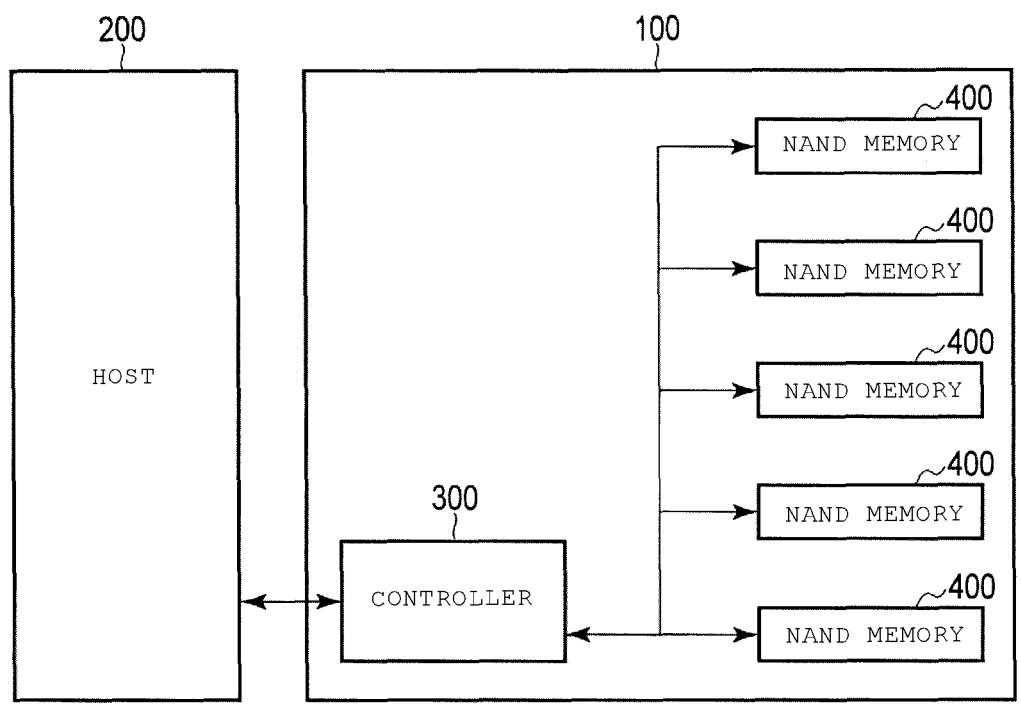
FIG. 1 is a diagram illustrating a memory system and a host.

Embodiments provide a semiconductor memory device that can reduce ZQ calibration time, such that the amount of time data transfer is prevented during ZQ calibration can be reduced.

In general, according to one embodiment, a semiconductor memory device includes a first circuit configured to process data received from and transmitted to an external controller, a second circuit configured to execute calibration on the first circuit, and a control circuit configured to control the second circuit to execute the calibration on the first circuit in response to a calibration command received from the external controller. In response to a first calibration command, the control circuit controls the second circuit to execute the calibration on the first circuit. In response to a second calibration command that is received after the first calibration command, the control circuit controls the second circuit to execute the calibration on the first circuit if a first condition is met and to not execute the calibration on the first circuit if the first condition is not met.

The present embodiment will be described with reference to the accompanying drawings. In the drawings, the same reference numerals are given to the same portions.

First Embodiment

Hereinafter, a semiconductor memory device according to a first embodiment will be described with reference to FIGS. 1 to 15. In the following, although a case where the semiconductor memory device is a NAND memory will be described, the semiconductor memory device is not limited thereto, and may be any nonvolatile semiconductor memory.

In the following description, "connection" includes not only the case of direct connection but also the case of indirect connection through any element.

Configuration Example of First Embodiment

FIG. 1 is a diagram illustrating a memory system 100 and host 200.

As illustrated in FIG. 1, the memory system 100 includes a controller 300 and NAND memories (more generally, semiconductor memory devices) 400.

The controller 300 controls the NAND memory 400 based on, for example, data (user data or the like), a command, and an address from the host 200. The controller 300 transfers the data, the command, and the address from the host 200, to the NAND memory 400. In addition, the controller 300 generates various signals and outputs the generated signals to the NAND memory 400. In FIG. 1, although five NAND memories 400 are illustrated, the number of the NAND memories is not limited thereto, and may be appropriately changed.

Figure 2:
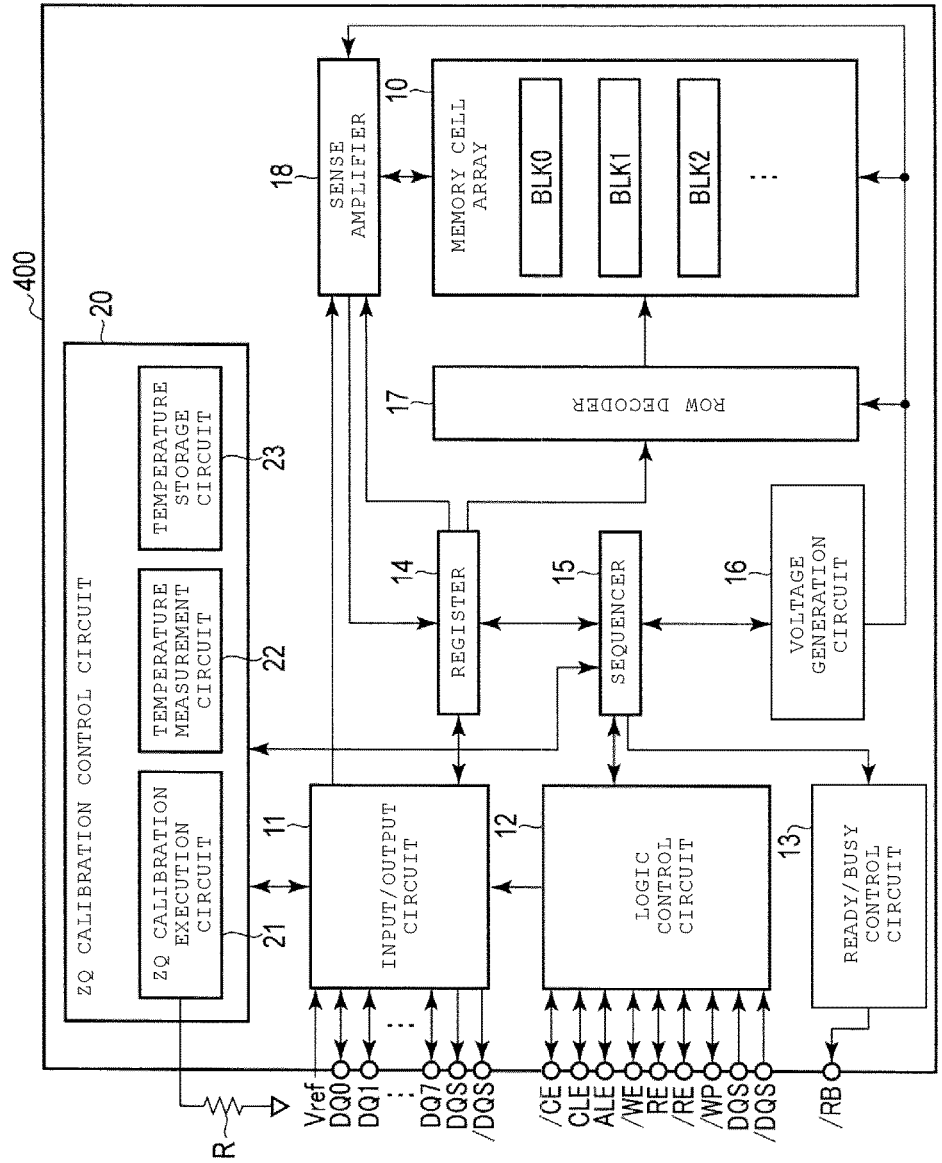
FIG. 2 is a diagram illustrating a semiconductor memory device according to a first embodiment.
Figure 3:
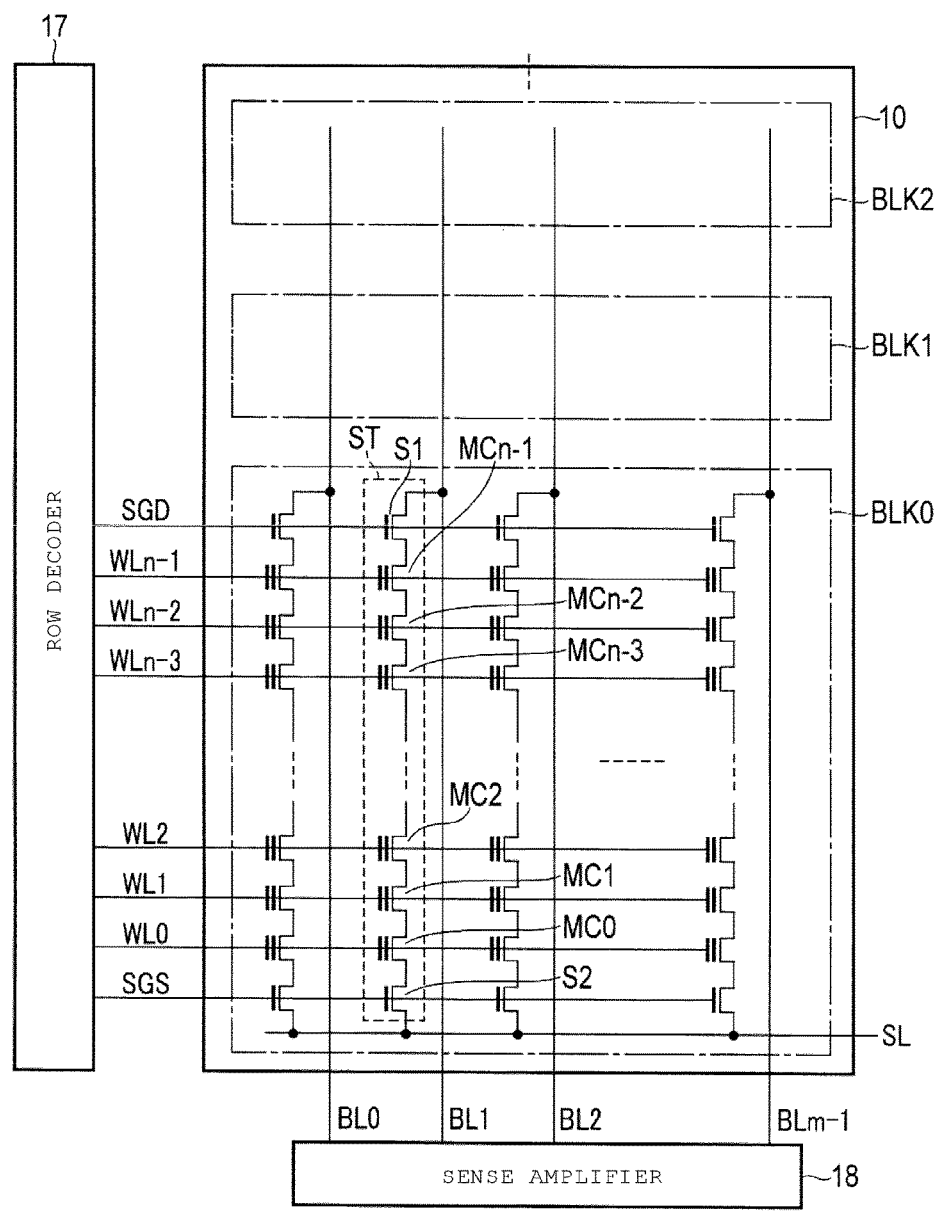
FIG. 3 is a diagram illustrating a memory cell array in the semiconductor memory device according to the first embodiment.

FIG. 2 is a diagram illustrating the semiconductor memory device 400 according to a first embodiment. FIG. 3 is a diagram illustrating a memory cell array 10 in the semiconductor memory device 400 according to the first embodiment.

As illustrated in FIG. 2, the semiconductor memory device 400 includes a memory cell array 10, an input/output circuit 11, a logic control circuit 12, a ready/busy control circuit 13, a register 14, a sequencer 15, a voltage generation circuit 16, a row decoder 17, a sense amplifier 18, and a ZQ calibration control circuit 20.

The memory cell array 10 includes a plurality of blocks BLK (BLK0, BLK1, . . . ). More specifically, as illustrated in FIG. 3, the block BLK0 includes a plurality of NAND strings ST. Each NAND string ST includes, for example, n (n is an integer of two or more) memory cell transistors MC (MC0 to MCn−1), and select transistors S1 and S2.

Each of the memory cell transistors MC (hereinafter, simply referred to as memory cells MC) includes a stacked gate including a control gate and a charge storage layer, and holds the data in a nonvolatile manner. The current path between the memory cell transistors MC0 to MCn−1 is formed in series. The first terminal of the memory cell transistor MCn−1 at one end of the NAND string ST is connected to the first terminal of the select transistor S1, and the first terminal of the memory cell transistor MC0 at the other end of the NAND string ST is connected to the first terminal of the select transistor S2.

The gates of the plurality of select transistors S1 are commonly connected to a select gate line SGD. On the other hand, the gates of the plurality of select transistors S2 are commonly connected to a select gate line SGS. The control terminals of each of the memory cell transistors MC0 to MCn−1 are commonly connected to each of word lines WL0 to WLn−1.

Among the NAND strings ST that are disposed in a matrix configuration in the memory cell array 10, the second terminals of the select transistors S1 of the NAND strings ST that are in the same column (arranged across the blocks BLK) are commonly connected to any one of bit lines BL (BL0 to BLm−1, m is an integer of 2 or more). The second terminals of the select transistors S2 are commonly connected to a source line SL. The source line SL is common, for example, in the plurality of blocks BLK.

The data of the memory cell transistors MC in the same block BLK are erased, for example, collectively. In contrast, reading and writing of the data are collectively executed for the plurality of memory cell transistors MC that are commonly connected to any one of the word lines WL in any one of the blocks BLK. This unit of data reading or writing is referred to as a "page".

The structures of the blocks BLK1 and BLK2 are the same as that of the block BLK0, and thus the description thereof will be omitted.

As illustrated in FIG. 2, the input/output circuit 11 transmits and receives signals DQ (DQ0 to DQ7) from the outside (the controller 300) of the semiconductor memory device 400. The signals DQ include the command, the address, the data, and the like. The input/output circuit 11 transfers the command and the address from the outside to the register 14. The input/output circuit 11 transfers the write data from the outside to the sense amplifier 18, and transfers the read data from the sense amplifier 18 to the outside. The input/output circuit 11 receives a voltage Vref from the outside. The Voltage Vref is a reference voltage, and set as a reference voltage in the various operations. The input/output circuit 11 transmits a data strobe signal DQS or /DQS to the outside together with the read data. The read data is read in synchronization with the signal DQS or /DQS.

The logic control circuit 12 receives various control signals from the outside, and controls the input/output circuit 11 and the sequencer 15. As the control signal, for example, a chip enable signal /CE, a command latch enable signal CLE, an address latch enable signal ALE, a write enable signal /WE, a read enable signal RE or /RE, a write protect signal /WP, and the data strobe signal DQS or /DQS are used. The signal /CE enables the semiconductor memory device 400. Each of the signal CLE and the signal ALE notifies that the signals DQ are the command or the address, to the input/output circuit 11. The signal /WE instructs the input/output circuit 11 to receive the signals DQ. The signal RE or /RE instructs the input/output circuit 11 to output the signals DQ. The signal /WP causes the semiconductor memory device 400 to go into a protection state, for example, at the time of power on-off. The signal DQS or /DQS is received together with the write data. The write data is written in synchronization with the signal DQS or /DQS.

The ready/busy control circuit 13 notifies the state of the semiconductor memory device 400 to the outside by transferring a signal /RB to the outside. The signal /RB indicates whether the semiconductor memory device 400 is in a ready state (a state where a command is received from the outside) or in a busy state (a state where a command is not received from the outside).

The register 14 holds the command and the address. The register 14 transfers the address to the row decoder 17 and the sense amplifier 18, and transfers the command to the sequencer 15. The register 14 holds various tables for controlling a sequence that is executed based on the command.

The sequencer 15 receives the command, and refers to the various tables of the register 14. The sequencer 15 controls the entire semiconductor memory device 400 according to the information indicated in the various tables.

The voltage generation circuit 16 generates a voltage that is necessary for operations such as writing, reading, erasing, and the like of the data under the control of the sequencer 15. The voltage generation circuit 16 supplies the generated voltage to the row decoder 17 and the sense amplifier 18.

The row decoder 17 receives a row address from the register 14, and selects the word line WL in the memory cell array 10 based on the row address. The row decoder 17 supplies the voltage from the voltage generation circuit 16 to the selected word line WL.

The sense amplifier 18 reads the data of the memory cells MC via the bit lines BL in the memory cell array 10, or writes the data in the memory cells MC in the memory cell array 10 via the bit lines BL. The sense amplifier 18 includes a data latch (not illustrated), and the data latch temporarily stores the write data and the read data. The sense amplifier 18 receives a column address from the register 14, and outputs the data of the data latch to the input/output circuit 11 based on the column address.

The ZQ calibration control circuit 20 includes a ZQ calibration execution circuit 21, a temperature measurement circuit 22, and a temperature storage circuit 23.

The temperature measurement circuit 22 measures the temperature of the input/output circuit 11, and acquires the temperature information, under the control of the sequencer 15.

The temperature storage circuit 23 is, for example, a latch, and stores the temperature information acquired by the temperature measurement circuit 22 under the control of the sequencer 15.

The ZQ calibration execution circuit 21 executes ZQ calibration for the input/output circuit 11 (hereinafter, sometimes referred to as calibration), under the control of the sequencer 15. The ZQ calibration execution circuit 21 compares the temperature information (first temperature information) stored in the temperature storage circuit 23 with the temperature information (second temperature information) that is newly acquired in the temperature measurement circuit 22, under the control of the sequencer 15. The ZQ calibration execution circuit 21 executes or does not execute the ZQ calibration for the input/output circuit 11 according to the comparison result.

Here, the ZQ calibration is a function of adjusting the output impedance (output resistance) of the input/output circuit 11 by using an external resistor (termination resistor) R that is connected to the ZQ calibration execution circuit 21. More specifically, in the ZQ calibration execution circuit 21 (between the resistor R and the input/output circuit 11), a plurality of transistors that are connected to each other in parallel are provided. The number of the transistors of which channels electrically connect (sum of the widths of the channels that electrically connect) is adjusted by selectively turning on the transistors, and thus the output resistance of the input/output circuit 11 is adjusted. The ZQ calibration is mainly executed when outputting the data to the outside. In the following, the ZQ calibration will be described in detail.

Figure 4:
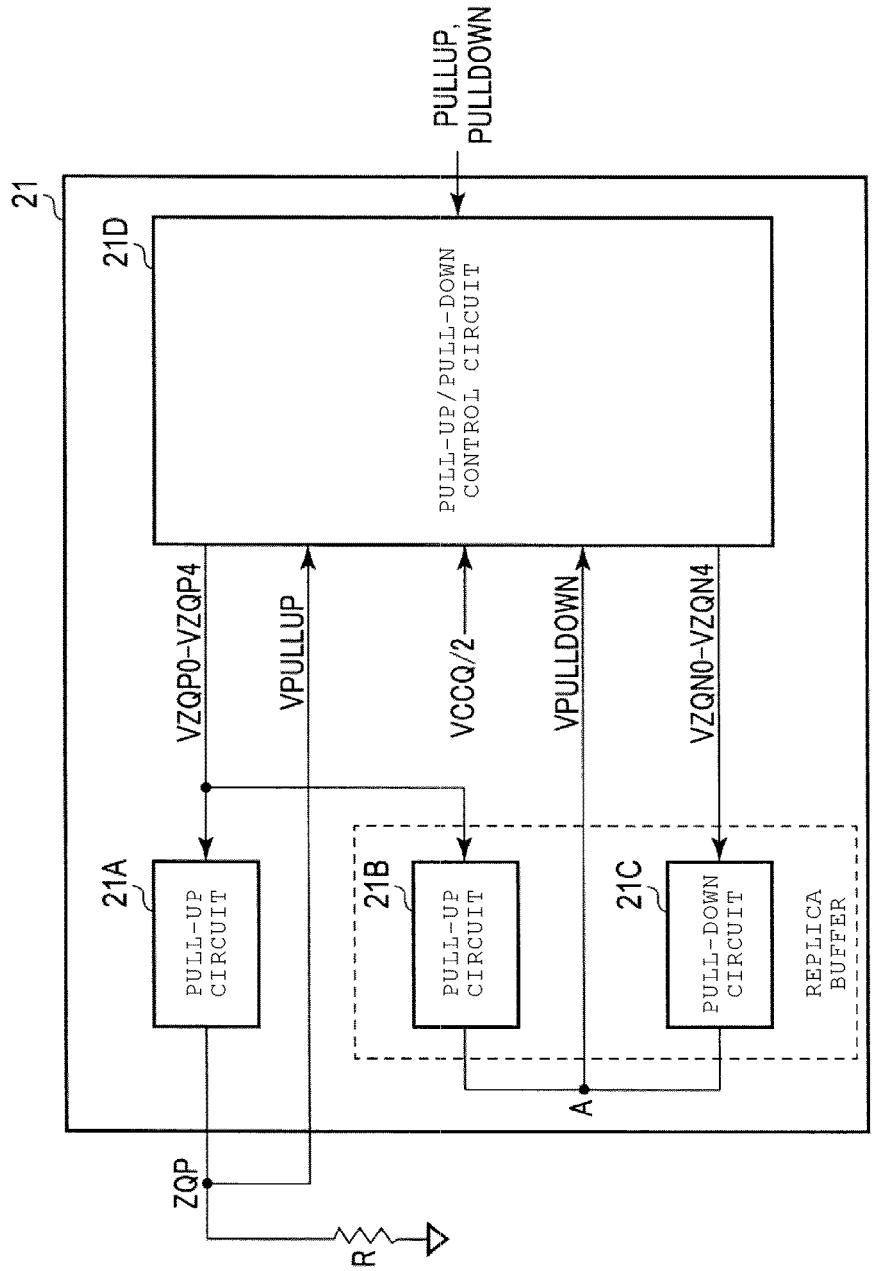
FIG. 4 is a diagram illustrating an example of a ZQ calibration execution circuit in the semiconductor memory device according to the first embodiment.

FIG. 4 is a diagram illustrating an example of the ZQ calibration execution circuit 21 in the semiconductor memory device 400 according to the first embodiment.

As illustrated in FIG. 4, the ZQ calibration execution circuit 21 includes pull-up circuits 21A and 21B, a pull-down circuit 21C, and a pull-up/pull-down control circuit 21D.

The pull-up/pull-down control circuit 21D receives a signal PULLUP or PULLDOWN, and controls the pull-up circuits 21A and 21B, and the pull-down circuit 21C.

The pull-up/pull-down control circuit 21D supplies voltages VZQP0 to VZQP4 to the pull-up circuit 21A. The pull-up circuit 21A is electrically connected to a ZQ pad ZQP. The ZQ pad ZQP is grounded via a resistor R. The Voltage VPULLUP of the ZQ pad ZQP is supplied to the pull-up/pull-down control circuit 21D.

On the other hand, the pull-up circuit 21B and the pull-down circuit 21C constitute a replica buffer. The pull-up/pull-down control circuit 21D supplies the voltages VZQP0 to VZQP4 to the pull-up circuit 21B, and supplies voltages VZQN0 to VZQN4 to the pull-down circuit 21C. The pull-up circuit 21B and the pull-down circuit 21C are electrically connected to a node A. The voltage VPULLDOWN of the node A is supplied to the pull-up/pull-down control circuit 21D.

Figure 5:
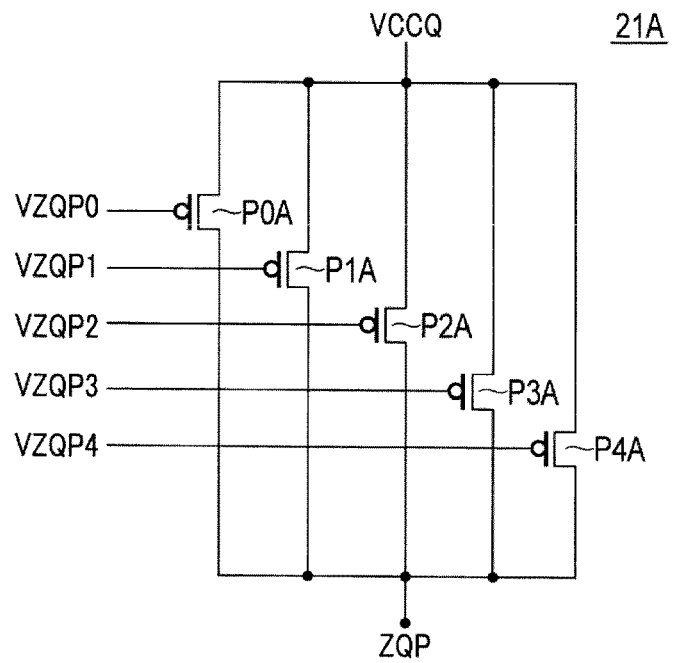
FIG. 5 is a diagram illustrating a pull-up circuit in the semiconductor memory device according to the first embodiment.
Figure 6:
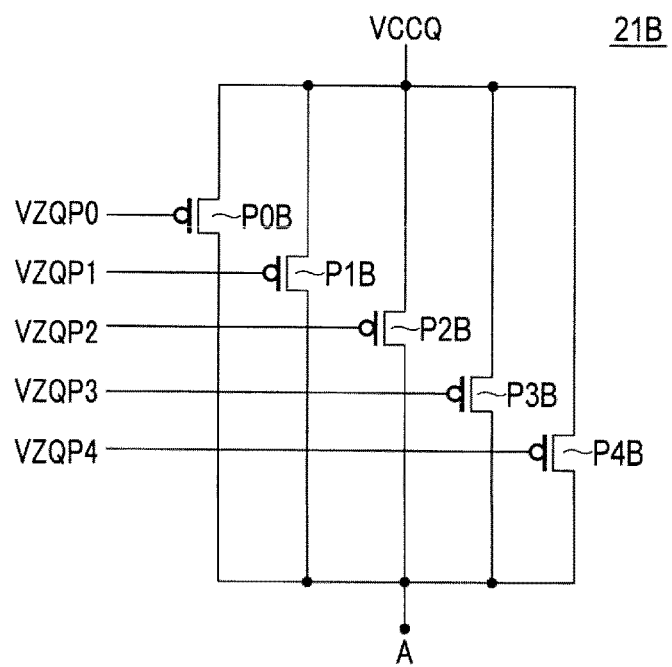
FIG. 6 is a diagram illustrating another pull-up circuit in the semiconductor memory device according to the first embodiment.
Figure 7:
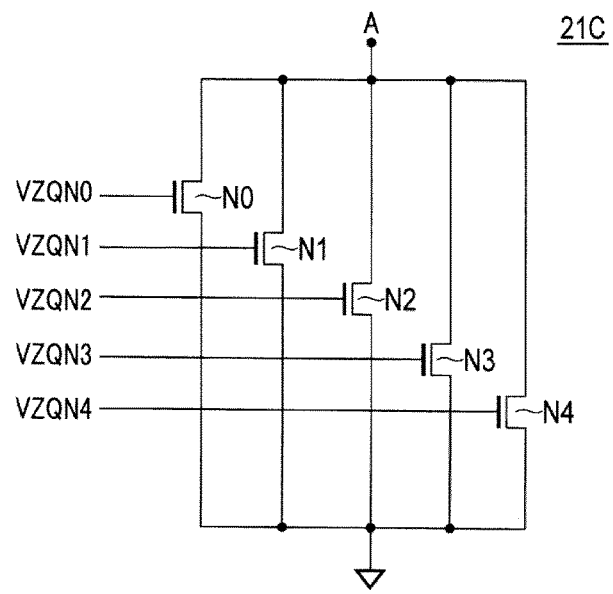
FIG. 7 is a diagram illustrating a pull-down circuit in the semiconductor memory device according to the first embodiment.

FIG. 5 is a diagram illustrating the pull-up circuit 21A in semiconductor memory device 400 according to the first embodiment, FIG. 6 is a diagram illustrating the pull-up circuit 21B in semiconductor memory device 400 according to the first embodiment, and FIG. 7 is a diagram illustrating the pull-down circuit 21C in the semiconductor memory device 400 according to the first embodiment.

As illustrated in FIG. 5, the pull-up circuit 21A includes PMOS transistors P0A to P4A. A voltage VCCQ is respectively supplied to each of the first terminals (one of the sources and the drains) of the PMOS transistors P0A to P4A, and each of the second terminals (the other of the sources and the drains) of the PMOS transistors P0A to P4A is electrically to the ZQ pad ZQP. Each of the voltages VZQP0 to VZQP4 is supplied to one of the gates of the PMOS transistors P0A to P4A.

As illustrated in FIG. 6, the pull-up circuit 21B includes PMOS transistors P0B to P4B. The voltage VCCQ is respectively supplied to each of the first terminals (one of the sources and the drains) of the PMOS transistors P0B to P4B, and each of the second terminals (the other of the sources and the drains) of the PMOS transistors P0B to P4B is electrically connected to the node A. Each of the voltages VZQP0 to VZQP4 is supplied to one of the gates of the PMOS transistors P0B to P4B.

As illustrated in FIG. 7, the pull-down circuit 21C includes NMOS transistors N0 to N4. Each of the first terminals (one of sources and drains) of the NMOS transistors N0 to N4 is electrically connected to the node A, and each of the second terminals (the other of sources and drains) of the NMOS transistors N0 to N4 is grounded. Each of the voltages VZQN0 to VZQN4 is supplied to one of the gates of the NMOS transistors N0 to N4.

As illustrated in FIG. 4, the ZQ calibration is executed by connecting the resistor R to the ZQ pad ZQP. The resistor R has a desired resistance value of the input/output circuit 11. In the ZQ calibration, the voltages VZQP0 to VZQP4 are determined such that the resistance of the resistor R and the impedance of the pull-up circuits 21A and 21B are the same. Further, the voltages VZQN0 to VZQN4 are determined such that the impedance of the pull-up circuit 21B and the impedance of the pull-down circuit 21C are the same. The acquired voltages VZQP0 to VZQP4 and VZQN0 to VZQN4 are appropriately supplied to each of the gates of the transistors (not illustrated) of the input/output circuit 11, and thus the output impedance of the input/output circuit 11 is adjusted to an optimum value. In the following, an example of the ZQ calibration will be described.

Figure 8:
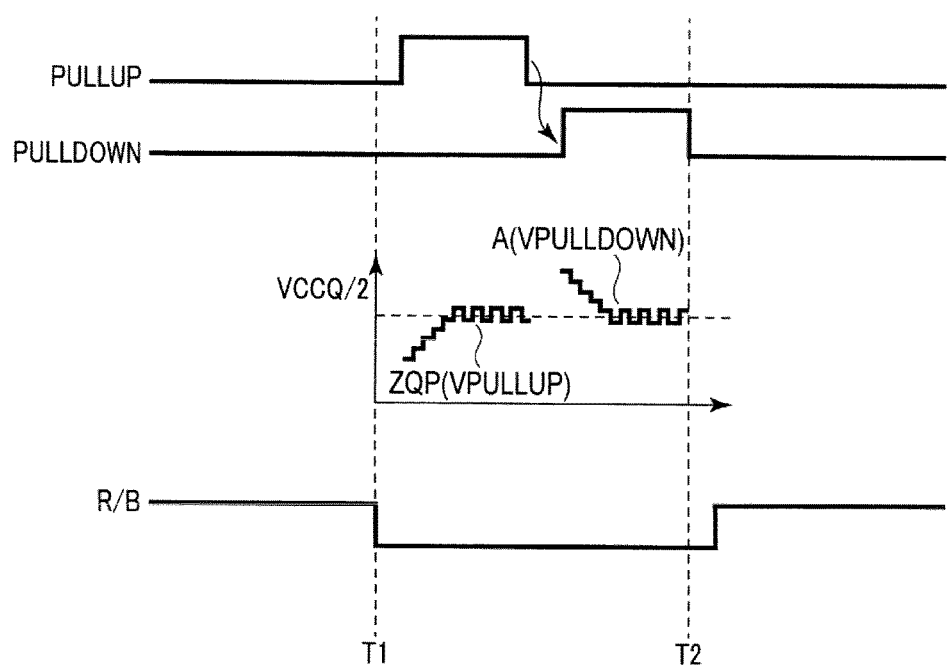
FIG. 8 is a diagram illustrating an example of a timing chart of various signals during ZQ calibration carried out in the semiconductor memory device according to the first embodiment.

FIG. 8 is a diagram illustrating an example of a timing chart of various signals during the ZQ calibration in semiconductor memory device 400 according to the first embodiment. In FIG. 8, the voltage applied to the ZQ pad ZQP is the voltage VPULLUP, and the voltage applied to the node A is the voltage VPULLDOWN. The ZQ calibration of the first embodiment and the embodiments described below is carried out by ZQ calibration control circuit 20 under the control of sequencer 15.

As illustrated in FIG. 8, first, at time T1, the semiconductor memory device 400 goes into a busy state. Then, the signal PULLUP is activated (becomes an H level). During a period for which the signal PULLUP is activated, the impedance adjustment of the pull-up circuit 21A is executed. In the impedance adjustment of the pull-up circuit 21A, the pull-up/pull-down control circuit 21D compares the voltage VPULLUP of the ZQ pad ZQP and the reference voltage VCCQ/2, and adjusts the voltages VZQP0 to VZQP4 such that the voltage VPULLUP of the ZQ pad ZQP and the reference voltage VCCQ/2 are equal.

More specifically, first, the pull-up/pull-down control circuit 21D sets the voltages VZQP0 to VZQP4 to all H levels (11111) as initial values. Accordingly, the PMOS transistors P0A to P4A of the pull-up circuit 21A are turned off. At this time, the voltage VPULLUP of the ZQ pad ZQP is, for example, a ground voltage, and less than the reference voltage VCCQ/2. As a result, the pull-up/pull-down control circuit 21D counts down the voltages VZQP0 to VZQP4, and sets the voltages VZQP0 to VZQP4 to (01111). Here, count-down indicates that any 0 (L level) of the voltages VZQP0 to VZQP4 is changed to 1 (H level). One the other hand, count-up indicates that any 1 (H level) of the voltages VZQP0 to VZQP4 is changed to 0 (L level).

When the voltages VZQP0 to VZQP4 are set to (01111), the PMOS transistor P0A of the pull-up circuit 21A is turned-on, and the PMOS transistors P1A to P4A are turned-off. Accordingly, the voltage VPULLUP of the ZQ pad ZQP is slightly increased by the voltage VCCQ.

When the voltage VPULLUP is still less than the reference voltage VCCQ/2, the pull-up/pull-down control circuit 21D counts down the voltages VZQP0 to VZQP4 to (00111). As a result, the voltage VPULLUP of the ZQ pad ZQP is further increased by the voltage VCCQ. In this way, when the voltage VPULLUP is less than the reference voltage VCCQ/2, the count-down of the voltages VZQP0 to VZQP4 is subsequently repeated, and thus the voltage VPULLUP is increased. In other words, the impedance of the pull-up circuit 21A is decreased.

On the other hand, when the voltage VPULLUP becomes greater than the reference voltage VCCQ/2, the voltages VZQP0 to VZQP4 are counted up. For example, in a case where the voltages VZQP0 to VZQP4 are (00011), the voltages VZQP0 to VZQP4 are set to (00111). In this way, the voltages VZQP0 to VZQP4 are counted down/up by the magnitude between the voltage VPULLUP of the ZQ pad ZQP and the reference voltage VCCQ/2. As a result, the voltage VPULLUP of the ZQ pad ZQP is stabilized in the vicinity of the reference voltage VCCQ/2.

When the voltage VPULLUP of the ZQ pad ZQP is stabilized in the vicinity of the reference voltage VCCQ/2, the signal PULLUP is deactivated (becomes L level). Accordingly, the pull-up/pull-down control circuit 21D terminates the counting of the voltages VZQP0 to VZQP4, and the counted values at that time are fixed. The voltages VZQP0 to VZQP4 are determined, and thus the impedance adjustment of the pull-up circuit 21A is terminated. The impedance of the pull-up circuit 21A at that time is equal to the resistance value of the resistor R.

During the period of the operation, the impedance adjustment of the pull-up circuit 21B is also executed in the same manner. More specifically, also in the pull-up circuit 21B, the same voltages VZQP0 to VZQP4 as those of the pull-up circuit 21A are set. In other words, the impedance of the pull-up circuit 21B is set to be the same as that of the pull-up circuit 21A.

Next, the impedance of the pull-down circuit 21C is adjusted to be the same as the impedance of the pull-up circuit 21A. More specifically, in a state where the impedance of the pull-up circuit 21A is fixed, that is, in a state where the impedance of the pull-up circuit 21B is fixed, the signal PULLDOWN is activated (becomes H level). In the period for which the signal PULLDOWN is activated, the impedance adjustment of the pull-down circuit 21C is executed. In the impedance adjustment of the pull-down circuit 21C, the pull-up/pull-down control circuit 21D compares the voltage VPULLDOWN of the node A and the reference voltage VCCQ/2, and adjusts the voltages VZQN0 to VZQN4 such that the voltage VPULLDOWN of the node A and the reference voltage VCCQ/2 are equal.

More specifically, first, the pull-up/pull-down control circuit 21D sets the voltages VZQN0 to VZQN4 to all L level (00000) as initial values. Accordingly, the NMOS transistors N0 to N4 of the pull-down circuit 21C are turned-off. At this time, the voltage VPULLDOWN of the node A is, for example, the power supply voltage, and greater than the reference voltage VCCQ/2. As a result, the pull-up/pull-down control circuit 21D counts up the voltages VZQN0 to VZQN4, and sets the voltages VZQN0 to VZQN4 to (10000).

When the voltages VZQN0 to VZQN4 are set to (10000), the NMOS transistor N0 of the pull-down circuit 21C is turned-on, and the NMOS transistors N1 to N4 are turned-off. Accordingly, the voltage VPULLDOWN of the node A is decreased by the ground voltage. When the voltage VPULLDOWN is greater than the reference voltage VCCQ/2, the pull-up/pull-down control circuit 21D counts up the voltages VZQN0 to VZQN4 to (11000). As a result, the voltage VPULLDOWN of the node A is further decreased by the ground voltage. In this way, when the voltage VPULLDOWN is greater than the reference voltage VCCQ/2, the count-up of the voltages VZQN0 to VZQN4 is subsequently repeated, and thus the voltage VPULLDOWN is decreased. In other words, the impedance of the pull-down circuit 21C is decreased.

On the other hand, when the voltage VPULLDOWN is less than the reference voltage VCCQ/2, the voltages VZQN0 to VZQN4 are counted down. For example, in a case where the voltages VZQN0 to VZQN4 are (11100), the voltages VZQN0 to VZQN4 are set to (11000). In this way, the voltages VZQN0 to VZQN4 are counted up/down by the magnitude between the voltage VPULLDOWN of the node A and the reference voltage VCCQ/2. As a result, the voltage VPULLDOWN of the node A is stabilized in the vicinity of the reference voltage VCCQ/2.

When the voltage VPULLDOWN of the node A is stabilized in the vicinity of the reference voltage VCCQ/2, at time T2, the signal PULLDOWN is deactivated (becomes L level). Then, the semiconductor memory device 400 goes into a ready state. Accordingly, the pull-up/pull-down control circuit 21D terminates the counting of the voltages VZQN0 to VZQN4, and the counted values at that time are fixed. The voltages VZQN0 to VZQN4 are determined, and thus the impedance adjustment of the pull-down circuit 21C is terminated. The impedance of the pull-down circuit 21C at that time has a value equal to the impedance of the pull-up circuit 21B. In other words, the impedance of the pull-up circuits 21A and 21B and the impedance of the pull-down circuit 21C are set to be equal to the resistance value of the resistor R.

Although an example in which the ZQ calibration execution circuit 21, the temperature measurement circuit 22, and the temperature storage circuit 23 are provided in the ZQ calibration control circuit 20 is illustrated, the configuration is not limited thereto, and these circuits may be independently provided.

ZQ Calibration Sequence According to First Embodiment

FIG. 9 is a flowchart illustrating a ZQ calibration sequence in the semiconductor memory device 400 according to the first embodiment. Each operation illustrated in FIG. 9 is executed by each circuit under the control of the sequencer 15.

As illustrated in FIG. 9, first, in step S11, a first (initial) ZQ calibration command is received from the external controller 300 by the input/output circuit 11.

Next, in step S12, the temperature of the input/output circuit 11 is measured by the temperature measurement circuit 22, and the measured temperature is acquired as first temperature information. The calibration for the input/output circuit 11 is executed by the ZQ calibration execution circuit 21. The first temperature information acquired by the temperature measurement circuit 22 is stored in the temperature storage circuit 23. Then, various operations are executed.

Next, in step S13, a second ZQ calibration command is received from the external controller 300 by the input/output circuit 11.

Next, in step S14, the temperature of the input/output circuit 11 is measured by the temperature measurement circuit 22, and the measured temperature is acquired as second temperature information.

Next, in step S15, first temperature information stored in the temperature storage circuit 23 and the second temperature information acquired by the temperature measurement circuit 22 are compared by the ZQ calibration execution circuit 21. More specifically, it is determined whether the difference between the first temperature information and the second temperature information is equal to or greater than a first value. The first value is a predetermined value or a value that is set by a set feature sequence to be described. The first value is appropriately set, for example, according to the need of the operation speed of the semiconductor memory device. For example, in a case of a high-speed operation, the first value is approximately 2° C. to 3° C., and in a case of a low-speed operation, the first value is approximately 10° C.

In step 15, in a case where the difference between the first temperature information and the second temperature information is equal to or greater than the first value, in step S16, the calibration for the input/output circuit 11 is executed by the ZQ calibration execution circuit 21. The second temperature information acquired by the temperature measurement circuit 22 is stored in the temperature storage circuit 23. In other words, the temperature information of the temperature storage circuit 23 is updated from the first temperature information to the second temperature information.

On the other hand, in step S15, in a case where the difference between the first temperature information and the second temperature information is less than the first value, the calibration and the update of the temperature information are not executed.

FIGS. 10A and 10B are timing charts illustrating specific examples of the various signals in the flowchart of FIG. 9. More specifically, a case of No in step S15 of FIG. 9 (first specific example) is illustrated in FIG. 10A, and a case of Yes in step S15 of FIG. 9 (second specific example) is illustrated in FIG. 10B.

As illustrated in FIG. 10A, in the first specific example, first, at time T1, the input/output circuit 11 receives a first ZQ calibration command ZQcalCMD as the signals DQ from the controller 300 (step S11). Accordingly, at time T2, the semiconductor memory device 400 goes into a busy state. The temperature measurement circuit 22 acquires the first temperature information, the ZQ calibration execution circuit 21 executes the calibration, and the temperature storage circuit 23 stores the first temperature information (step S12). Then, at time T3, the semiconductor memory device 400 goes into a ready state.

Next, at time T4, the input/output circuit 11 receives a second ZQ calibration command ZQcalCMD as the signals DQ from the controller 300 (step S13). Accordingly, at time T5, the semiconductor memory device 400 goes into a busy state. The temperature measurement circuit 22 acquires the second temperature information, and the ZQ calibration execution circuit 21 compares the first temperature information and the second temperature information (step S14 and step 15). In the first specific example, the difference between the first temperature information and the second temperature information is less than the first value (No in step S15), and thus the calibration and the update of the temperature information (step S16) are not executed. As a result, at time T6, the semiconductor memory device 400 goes into a ready state.

Then, at time T7, a read enable signal /RE is input from the controller 300 to the logic control circuit 12, and thus the input/output circuit 11 outputs data to the controller 300.

On the other hand, as illustrated in FIG. 10B, in the second specific example, at time T1 to T4, the same operations as those of the first specific example are executed (step S11 to step S13).

At time T4, when the second ZQ calibration command ZQcalCMD is received, at time T5, the semiconductor memory device 400 goes into a busy state. The temperature measurement circuit 22 acquires the second temperature information, and the ZQ calibration execution circuit 21 compares the first temperature information and the second temperature information (step S14 and step 15). In the second specific example, since the difference between the first temperature information and the second temperature information is equal to or greater than the first value (Yes in step S15), the ZQ calibration execution circuit 21 executes the calibration, and the temperature storage circuit 23 stores the second temperature information (step S16). As a result, at time T8, the semiconductor memory device 400 goes into a ready state.

Then, at time T9, a read enable signal /RE is input from the controller 300 to the logic control circuit 12, and thus the input/output circuit 11 outputs the data to the controller 300.

In this way, since step S16 is not executed in the first specific example, the period of the ready state based on the second ZQ calibration command ZQcalCMD (time T5 to T6) is shorter than the period of the ready state in the second specific example (time T5 to T8). Therefore, the start time and the end time of the data output in the first specific example are faster than those of the data output in the second specific example.

Command Sequence According to First Embodiment

In the above-described ZQ calibration sequence, the ZQ calibration execution circuit 21 executes a first mode calibration and a second mode calibration. In the first mode calibration, when the ZQ calibration command is received, the calibration is always executed (step S12). On the other hand, in the second mode calibration, when the ZQ calibration command is received, the calibration is executed or not executed according to the difference between the first temperature information and the second temperature information (step S15 and step S16). In the following, a command sequence for executing the first mode calibration and the second mode calibration will be described.

FIGS. 11A and 11B and FIG. 12 are diagrams illustrating first examples of a command sequence (special command sequence) in the semiconductor memory device 400 according to the first embodiment. The time scales illustrated in FIGS. 11A, 11B, and 12 are approximately the same. The first example is an example of executing the first mode calibration and then the second mode calibration using a special command.

More specifically, FIG. 11A is a diagram illustrating a case where the calibration is not executed in the second mode calibration of the first example, and FIG. 11B is a diagram illustrating a case where the calibration is executed in the second mode calibration of the first example. FIG. 12 is a diagram illustrating the normal mode calibration, e.g., the first mode calibration in the first example.

As illustrated in FIGS. 11A and 11B, in the second mode calibration of the first example, at time T1, the input/output circuit 11 receives a command SPZQcalCMD as the signals DQ from the controller 300. The command SPZQcalCMD is a special command that is different from a normal calibration command NormalZQcalCMD. The command SPZQcalCMD corresponds to the second ZQ calibration command that is received in step S13.

When the command SPZQcalCMD is received, at time T2, the semiconductor memory device 400 goes into a busy state. The second mode calibration is executed. In other words, as illustrated in FIG. 11A, in a case where the difference between the first temperature information and the second temperature information is less than the first value, the calibration is not executed, and at time T3, the semiconductor memory device 400 goes into a ready state. Then, at time T4, the data is output to the outside. As illustrated in FIG. 11B, in a case where the difference between the first temperature information and the second temperature information is equal to or greater than the first value, the calibration is executed, and at time T5, the semiconductor memory device 400 goes into a ready state. Then, at time T6, the data is output to the outside.

On the other hand, as illustrated in FIG. 12, in the first mode calibration of the first example, at time T1, the input/output circuit 11 receives a normal calibration command NormalZQcalCMD as the signals DQ from the controller 300. The command NormalZQcalCMD corresponds to the first ZQ calibration command that is received in step S11.

When the command NormalZQcalCMD is received, at time T2, the semiconductor memory device 400 goes into a busy state. The first mode calibration is executed. In other words, the calibration is always executed, and at time T3, the semiconductor memory device 400 goes into a ready state. Then, at time T4, the data is output to the outside.

In this way, in the first example, the second mode calibration is executed using the special command SPZQcalCMD, and the first mode calibration is executed using the normal command NormalZQcalCMD.

Figure 13:
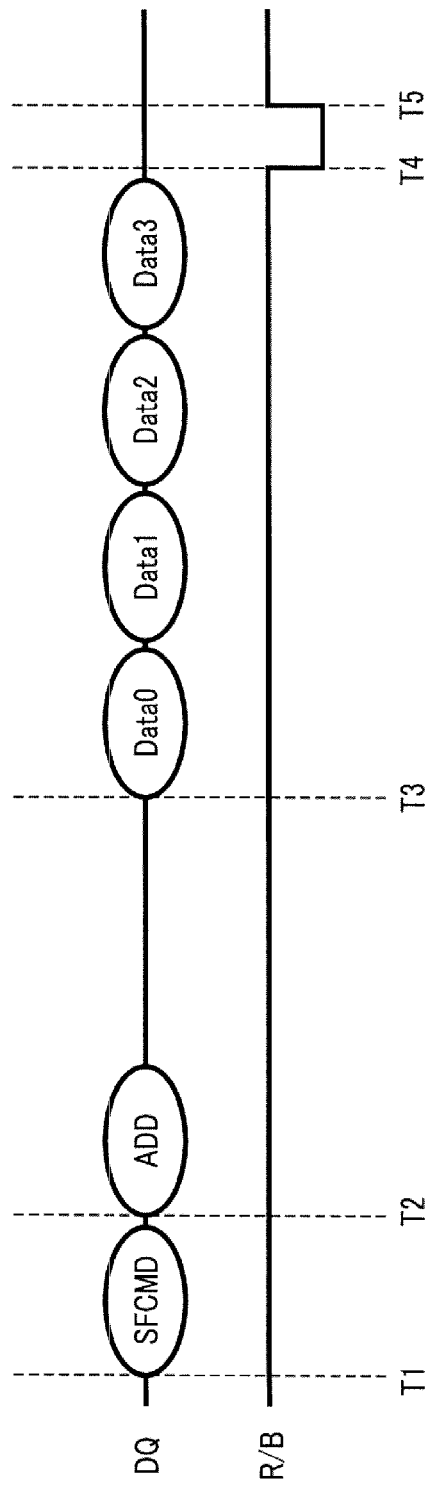
FIG. 13 is a diagram illustrating a set feature command sequence in semiconductor memory device according to the first embodiment.

FIGS. 13 to 15 are diagrams illustrating a second example (set feature command sequence) of a command sequence in the semiconductor memory device 400 according to the first embodiment. The second example is an example of setting the first mode calibration and the second mode calibration using a set feature command.

More specifically, FIG. 13 is a diagram illustrating a command sequence after the time of power-on in the second example. In FIG. 14A, a case where the calibration is not executed in the second mode calibration of the second example is illustrated, and in FIG. 14B, a case where the calibration is executed in the second mode calibration of the second example is illustrated. In FIG. 15, the first mode calibration in the second example is illustrated. The time scales illustrated in FIGS. 14A, 14B, and 15 are approximately the same.

As illustrated in FIG. 13, the set feature is configured with a command SFCMD, an address ADD, and data 0 to 3. As illustrated in the FIG. 13, when the power supply is turned-on in the second example, at time T1, the input/output circuit 11 receives the command SFCMD as the signals DQ from the controller 300. Sequentially, at time T2, the input/output circuit 11 receives the address ADD as the signals DQ from the controller 300. Then, at time T3, the input/output circuit 11 sequentially receives data 0 to 3 as the signals DQ from the controller 300.

The address ADD specifies a function number, and the data 0 to 3 set the parameters of the function indicated by the function number. In other words, the calibration function is specified by the address ADD. Whether the calibration function is the first mode or the second mode is set by the data 0 to 3. The first value or the like at the time of the second mode is set by the data 0 by 3.

Then, at time T4, the semiconductor memory device 400 goes into a busy state. Accordingly, the function is activated, and the calibration function is set to the first mode or the second mode. After the activation, at time T5, the semiconductor memory device 400 goes into a ready state.

As illustrated in FIGS. 14A and 14B, in the second mode calibration of the second example, at time T1, the input/output circuit 11 receives a command NormalZQcalCMD as the signals DQ from the controller 300. The command NormalZQcalCMD is different from the special command of the first example, and is a normal calibration command. The command NormalZQcalCMD, however, as a result of the set feature sequence, corresponds to the second ZQ calibration command that is received in step S13.

When the command NormalZQcalCMD is received, at time T2, the semiconductor memory device 400 goes into a busy state. The second mode calibration is executed. In other words, as illustrated in FIG. 14A, in a case where the difference between the first temperature information and the second temperature information is less than the first value, the calibration is not executed, and at time T3, the semiconductor memory device 400 goes into a ready state. Then, at time T4, the data is output to the outside. As illustrated in FIG. 14B, in a case where the difference between the first temperature information and the second temperature information is equal to or greater than the first value, the calibration is executed, and at time T5, the semiconductor memory device 400 goes into a ready state. Then, at time T6, the data is output to the outside.

On the other hand, as illustrated in FIG. 15, in the first mode calibration of the second example, which is similar to that of the first example, at time T1, the input/output circuit 11 receives a normal calibration command NormalZQcalCMD as the signals DQ from the controller 300. The command NormalZQcalCMD corresponds to the first ZQ calibration command that is received in step S11. The subsequent sequence is the same as that of the first example illustrated in FIG. 12.

In this way, in the second example, the first mode calibration is set at the time of power-on until the second mode calibration is set by the set feature, and both the first mode calibration and the second mode calibration are executed based on the setting using the normal command Normal-ZQcalCMD. In other words, in the second example, the first mode calibration or the second mode calibration is executed without using the special command.

Effect According to First Embodiment

According to the first embodiment, the semiconductor memory device 400 includes the ZQ calibration control circuit 20. The ZQ calibration control circuit 20 acquires the temperature information at the time of the calibration, and compares the acquired temperature information and the temperature information at the time of previous calibration. The ZQ calibration control circuit 20 does not execute the calibration when the temperature change is small (when the change in characteristics is small), and executes the calibration only when the temperature change is large (when the change in characteristics is large). Accordingly, it is possible to minimize the calibration time, and thus it is possible to prevent the limitation of the data transfer.

Second Embodiment

Hereinafter, a semiconductor memory device according to a second embodiment will be described with reference to FIG. 16 and FIGS. 17A and 17B. In the first embodiment, the temperature measurement circuit 22 acquires the temperature information at the time of the calibration. In contrast, in the second embodiment, the temperature measurement circuit 22 acquires the temperature information at the time of a core operation just before the calibration. In the following, the second embodiment will be described in detail.

In the second embodiment, the points that are mainly different from the first embodiment will be described, and description of similar points will be omitted.

ZQ Calibration Sequence According to Second Embodiment

FIG. 16 is a flowchart illustrating a ZQ calibration sequence in the semiconductor memory device 400 according to the second embodiment.

As illustrated in FIG. 16, first, in step S21, a core operation command is received from the external controller 300 by the input/output circuit 11. The core operation command is, for example, a write command, a read command, or an erase command.

Next, in step S22, a core operation (writing, reading, or erasing) is executed on the memory cell array 10. Further, the temperature of the input/output circuit 11 is measured by the temperature measurement circuit 22, and the measured temperature is acquired as the first temperature information.

Next, in step S23, a first (initial) ZQ calibration command is received from the external controller 300 by the input/output circuit 11.

Next, in step S24, the calibration for the input/output circuit 11 is executed by the ZQ calibration execution circuit 21. Further, the first temperature information acquired by the temperature measurement circuit 22 is stored in the temperature storage circuit 23. Then, various operations are executed.

Next, in step S25, a core operation command is received again from the external controller 300 by the input/output circuit 11. The core operation command is the same command as the core operation command received in step S21.

Next, in step S26, a core operation is executed on the memory cell array 10. Further, the temperature of the input/output circuit 11 is measured by the temperature measurement circuit 22, and the measured temperature is acquired as the second temperature information.

Next, in step S27, a second ZQ calibration command is received from the external controller 300 by the input/output circuit 11.

Next, in step S28, the first temperature information stored in the temperature storage circuit 23 and the second temperature information acquired by the temperature measurement circuit 22 are compared with each other by the ZQ calibration execution circuit 21. More specifically, it is determined whether or not the difference between the first temperature information and the second temperature information is equal to or greater than the first value.

In a case where, in step S28, the difference between the first temperature information and the second temperature information is equal to or greater than the first value, in step S29, the calibration for the input/output circuit 11 is executed by the ZQ calibration execution circuit 21. Further, the second temperature information acquired by the temperature measurement circuit 22 is stored in the temperature storage circuit 23. In other words, the temperature information of the temperature storage circuit 23 is updated from the first temperature information to the second temperature information.

On the other hand, in a case where, in step S28, the difference between the first temperature information and the second temperature information is less than the first value, the calibration and the update of the temperature information are not executed.

FIGS. 17A and 17B are timing charts illustrating specific examples of various signals in the flowchart of FIG. 16. More specifically, FIG. 17A illustrates a case of No in step S28 of FIG. 16 (first specific example), and FIG. 17B illustrates a case of Yes in step S28 of FIG. 16 (second specific example).

As illustrated in FIG. 17A, in the first specific example, first, at time T1, the input/output circuit 11 receives a core operation command (e.g., read command READCMD) as the signals DQ from the controller 300 (step S21). Here, an example in which reading is executed as the core operation is illustrated. Accordingly, at time T2, the semiconductor memory device 400 goes into a busy state. The data of the memory cell array 10 is read-out to the latch (not illustrated) in the sense amplifier 18. Further, the temperature measurement circuit 22 acquires first temperature information (step S22). Then, at time T3, the semiconductor memory device 400 goes into a ready state.

Sequentially, at time T4, the input/output circuit 11 receives a first ZQ calibration command ZQcalCMD as the signals DQ from the controller 300 (step S23). Accordingly, at time T5, the semiconductor memory device 400 goes into a busy state. The ZQ calibration execution circuit 21 executes the calibration, and the temperature storage circuit 23 stores the first temperature information (step S24). Then, at time T6, the semiconductor memory device 400 goes into a ready state. Although not illustrated, then, the data of the latch in the sense amplifier 18 is output to the outside by the input/output circuit 11.

Next, at time T7, the input/output circuit 11 receives again a read command READCMD as the signals DQ from the controller 300 (step S25). Accordingly, at time T8, the semiconductor memory device 400 goes into a busy state. The data of the memory cell array 10 is read-out to the latch in the sense amplifier 18. Further, the temperature measurement circuit 22 acquires second temperature information (step S26). Then, at time T9, the semiconductor memory device 400 goes into a ready state.

Sequentially, at time T10, the input/output circuit 11 receives a second ZQ calibration command ZQcalCMD as the signals DQ from the controller 300 (step S27). Accordingly, at time T11, the semiconductor memory device 400 goes into a busy state. The ZQ calibration execution circuit 21 compares the first temperature information and the second temperature information (step S28).

In the first specific example, since the difference between the first temperature information and the second temperature information is less than the first value (No in step S28), the calibration and the update of the temperature information (step S29) are not executed. As a result, at time T12, the semiconductor memory device 400 goes into a ready state.

Then, at time T13, a read enable signal /RE is input from the controller 300 to the logic control circuit 12, and thus the input/output circuit 11 outputs the data of the latch in the sense amplifier 18 to the controller 300.

On the other hand, as illustrated in FIG. 17B, in the second specific example, at time T1 to T10, the same operations as those of the first specific example are executed (step S21 to S27).

When the second ZQ calibration command ZQcalCMD is received at time T10, at time T11, the semiconductor memory device 400 goes into a busy state. The ZQ calibration execution circuit 21 compares the first temperature information and the second temperature information (step S28).

In the second specific example, since the difference between the first temperature information and the second temperature information is equal to or greater than the first value (Yes in step S28), the ZQ calibration execution circuit 21 executes the calibration, and the temperature storage circuit 23 stores the second temperature information (step S29). As a result, at time T14, the semiconductor memory device 400 goes into a ready state.

Then, at time T15, a read enable signal /RE is input from the controller 300 to the logic control circuit 12, and thus the input/output circuit 11 outputs the data to the controller 300.

In this way, since step S29 is not executed in the first specific example, the period of the ready state based on the second ZQ calibration command ZQcalCMD (time T11 to T12) becomes shorter than the period of the ready state in the second specific example (time T11 to T14). Therefore, the start time and the end time of the data output in the first specific example are faster than those of the data output in the second specific example.

FIGS. 18A and 18B are timing charts respectively illustrating a modification example of FIG. 17A and a modification example of FIG. 17B. More specifically, FIG. 18A illustrates a modification example of the first specific example illustrated in FIG. 17A, and FIG. 18B illustrates a modification example of the second specific example illustrated in FIG. 17B.

As illustrated in FIGS. 18A and 18B, in the modification examples, when, at time T8, the semiconductor memory device 400 goes into a busy state, the second ZQ calibration command ZQcalCMD is received while maintaining the busy state. The semiconductor memory device 400 is in a busy state until the operation according to the second ZQ calibration command ZQcalCMD is terminated. In other words, in the first specific example, the semiconductor memory device 400 is in a busy state at time T8 to T10, and in the second specific example, the semiconductor memory device 400 is in a busy state at time T8 to T12.

Effects According to Second Embodiment

Typically, in a NAND memory, the temperature information at the time of the core operation is acquired. In the second embodiment, the ZQ calibration control circuit 20 acquires the temperature information at the time of the core operation just before the calibration, and compares the acquired temperature information and the temperature information at the time of the core operation just before the previous calibration. In other words, the temperature information is typically acquired according to the core operation command rather than the ZQ calibration command. Therefore, there is no need to acquire the temperature information according to the ZQ calibration command, and thus it is possible to reduce the operations according to the ZQ calibration command compared to those of the first embodiment. As a result, it is possible to further prevent the limitation of the data output.

Third Embodiment

Hereinafter, a semiconductor memory device according to a third embodiment will be described with reference to FIGS. 19 and 20. In the first embodiment, the ZQ calibration control circuit 20 acquires the temperature information and executes the calibration according to the change in the temperature information. In contrast, in the third embodiment, the ZQ calibration control circuit 20 acquires voltage information and executes the calibration according to the change in the voltage information. In the following, the third embodiment will be described in detail.

In the third embodiment, the points that are mainly different from the first embodiment will be described, and description of similar points will be omitted.

Configuration Example of Third Embodiment

Figure 19:
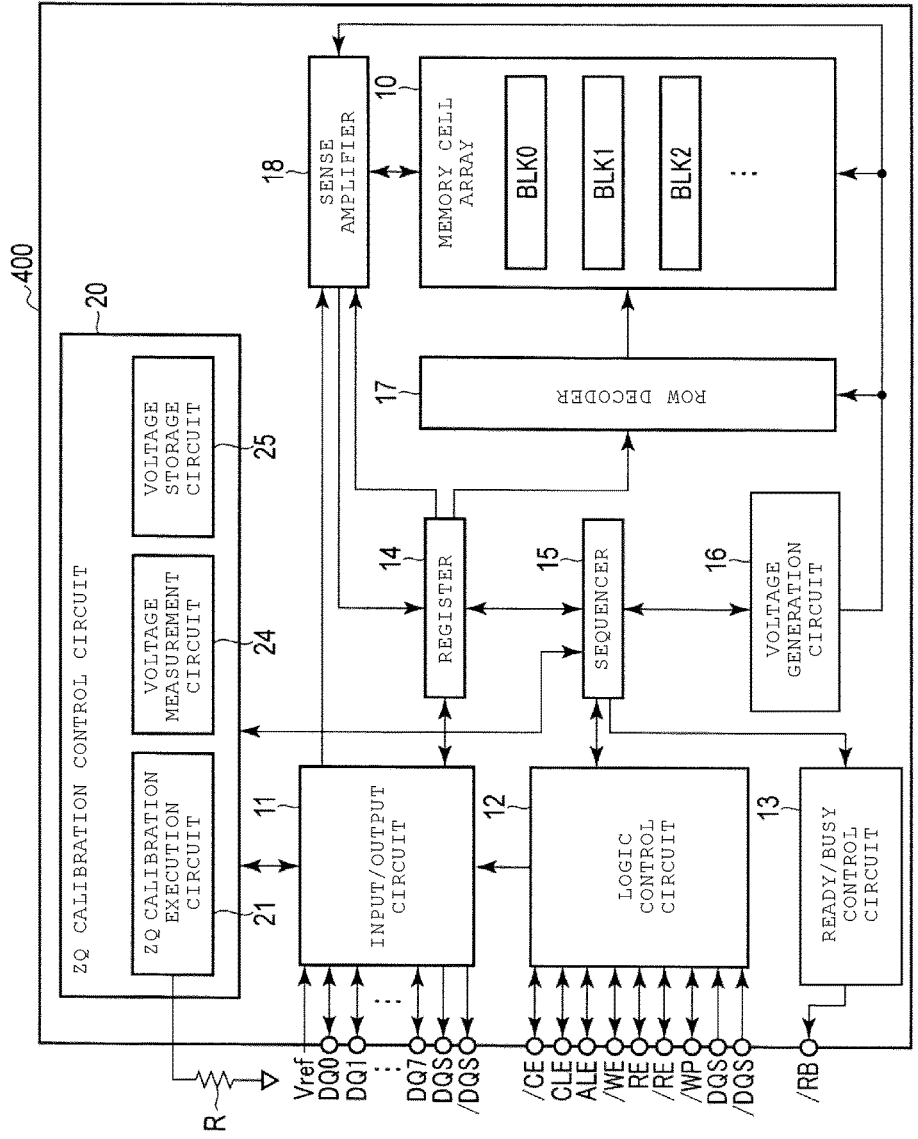
FIG. 19 is a diagram illustrating a semiconductor memory device according to a third embodiment.

FIG. 19 is a diagram illustrating a semiconductor memory device 400 according to the third embodiment.

As illustrated in FIG. 19, the ZQ calibration control circuit 20 includes the ZQ calibration execution circuit 21, a voltage measurement circuit 24, and a voltage storage circuit 25.

The voltage measurement circuit 24 measures the voltage applied to the input/output circuit 11, and acquires voltage information, under the control of the sequencer 15.

The voltage storage circuit 25 is, for example, a latch, and stores the voltage information acquired by the voltage measurement circuit 24, under the control of the sequencer 15.

The ZQ calibration execution circuit 21 compares the voltage information stored in the voltage storage circuit 25 (first voltage information) and the voltage information (second voltage information) that is newly acquired by the voltage measurement circuit 24, under the control of the sequencer 15. The ZQ calibration execution circuit 21 executes or does not execute the ZQ calibration for the input/output circuit 11 according to the comparison result.

Although an example in which the ZQ calibration execution circuit 21, the voltage measurement circuit 24, and the voltage storage circuit 25 are provided in the ZQ calibration control circuit 20 is illustrated, the configuration is not limited thereto, and the circuits may be provided independently.

ZQ Calibration Sequence According to Third Embodiment

Figure 20:
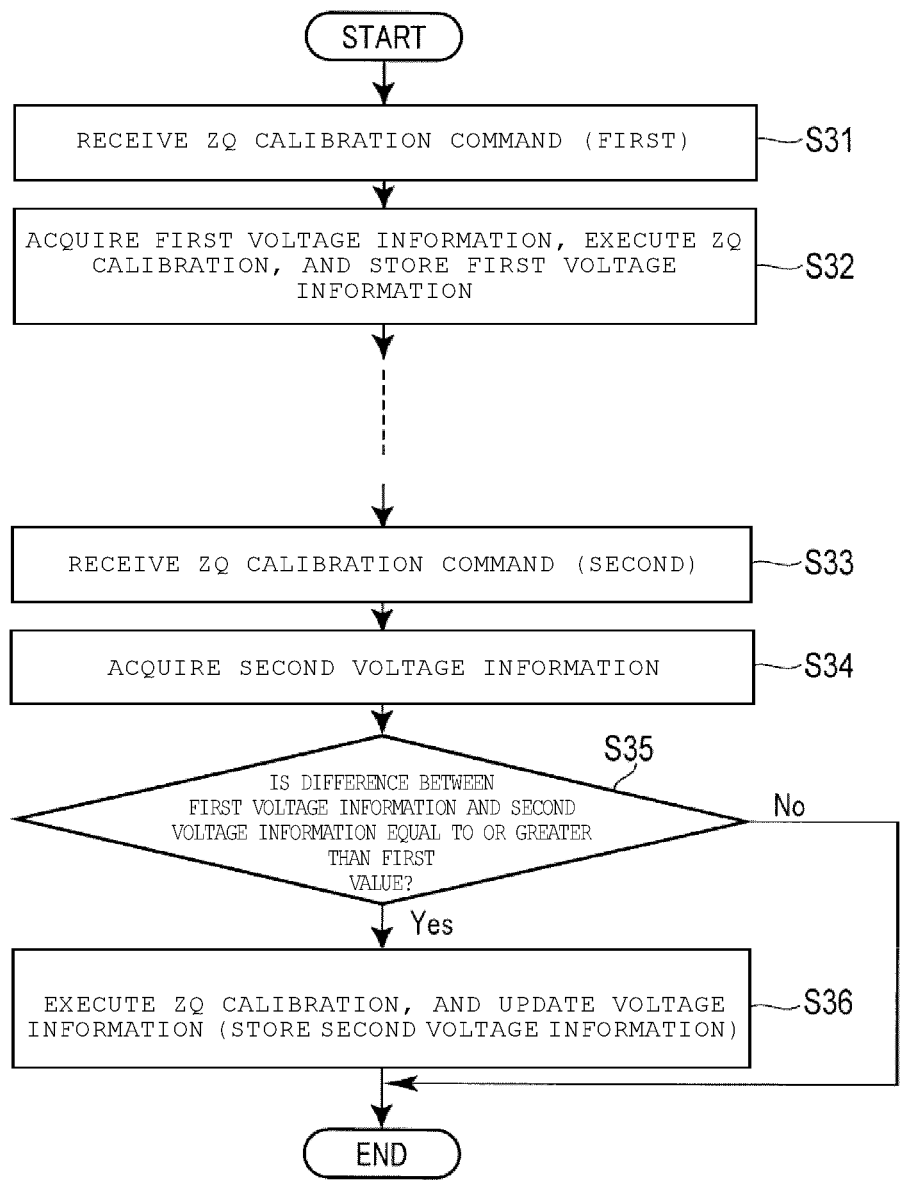
FIG. 20 is a flowchart illustrating a ZQ calibration sequence executed in the semiconductor memory device according to the third embodiment.

FIG. 20 is a flowchart illustrating a ZQ calibration sequence in a semiconductor memory device 400 according to the third embodiment.

As illustrated in FIG. 20, first, in step S31, a first (initial) ZQ calibration command is received from the external controller 300 by the input/output circuit 11.

Next, in step S32, the voltage that is applied to the input/output circuit 11 is measured by the voltage measurement circuit 24, and the measured voltage is acquired as the first voltage information. In addition, the calibration for the input/output circuit 11 is executed by the ZQ calibration execution circuit 21. Further, the first voltage information acquired by the voltage measurement circuit 24 is stored in the voltage storage circuit 25. Then, various operations are executed.

Next, in step S33, a second ZQ calibration command is received from the external controller 300 by the input/output circuit 11.

Next, in step S34, the voltage that is applied to the input/output circuit 11 is measured by the voltage measurement circuit 24, and the measured voltage is acquired as the second voltage information.

Next, in step S35, the first voltage information stored in the voltage storage circuit 25 and the second voltage information acquired by the voltage measurement circuit 24 are compared with each other by the ZQ calibration execution circuit 21. More specifically, it is determined whether or not the difference between the first voltage information and the second voltage information is equal to or greater than the first value.

In a case where, in step S35, the difference between the first voltage information and the second voltage information is equal to or greater than the first value, in step S36, the calibration for the input/output circuit 11 is executed by the ZQ calibration execution circuit 21. Further, the second voltage information acquired by the voltage measurement circuit 24 is stored in the voltage storage circuit 25. In other words, the voltage information of the voltage storage circuit 25 is updated from the first voltage information to the second voltage information.

On the other hand, in a case where, in step S35, the difference between the first voltage information and the second voltage information is less than the first value, the calibration and the update of the voltage information are not executed.

Effects According to Third Embodiment

According to the third embodiment, the ZQ calibration control circuit 20 acquires the voltage information at the time of the calibration, and compares the acquired voltage information and the voltage information at the time of the previous calibration. The ZQ calibration control circuit 20 does not execute the calibration when the voltage change is small (when the change in characteristics is small), and executes the calibration only when the voltage change is large (when the change in characteristics is large). Accordingly, it is possible to obtain the same effects as those of the first embodiment.

Fourth Embodiment

In the following, a semiconductor memory device according to a fourth embodiment will be described with reference to FIG. 21. The fourth embodiment is a combination of the second embodiment and the third embodiment. In other words, in the fourth embodiment, the voltage measurement circuit 24 acquires the voltage information at the time of the core operation just before the calibration. In the following, the fourth embodiment will be described in detail.

In the fourth embodiment, the points that are mainly different from the second embodiment and the third embodiment will be described, and description of similar points will be omitted.

ZQ Calibration Sequence According to Fourth Embodiment

Figure 21:
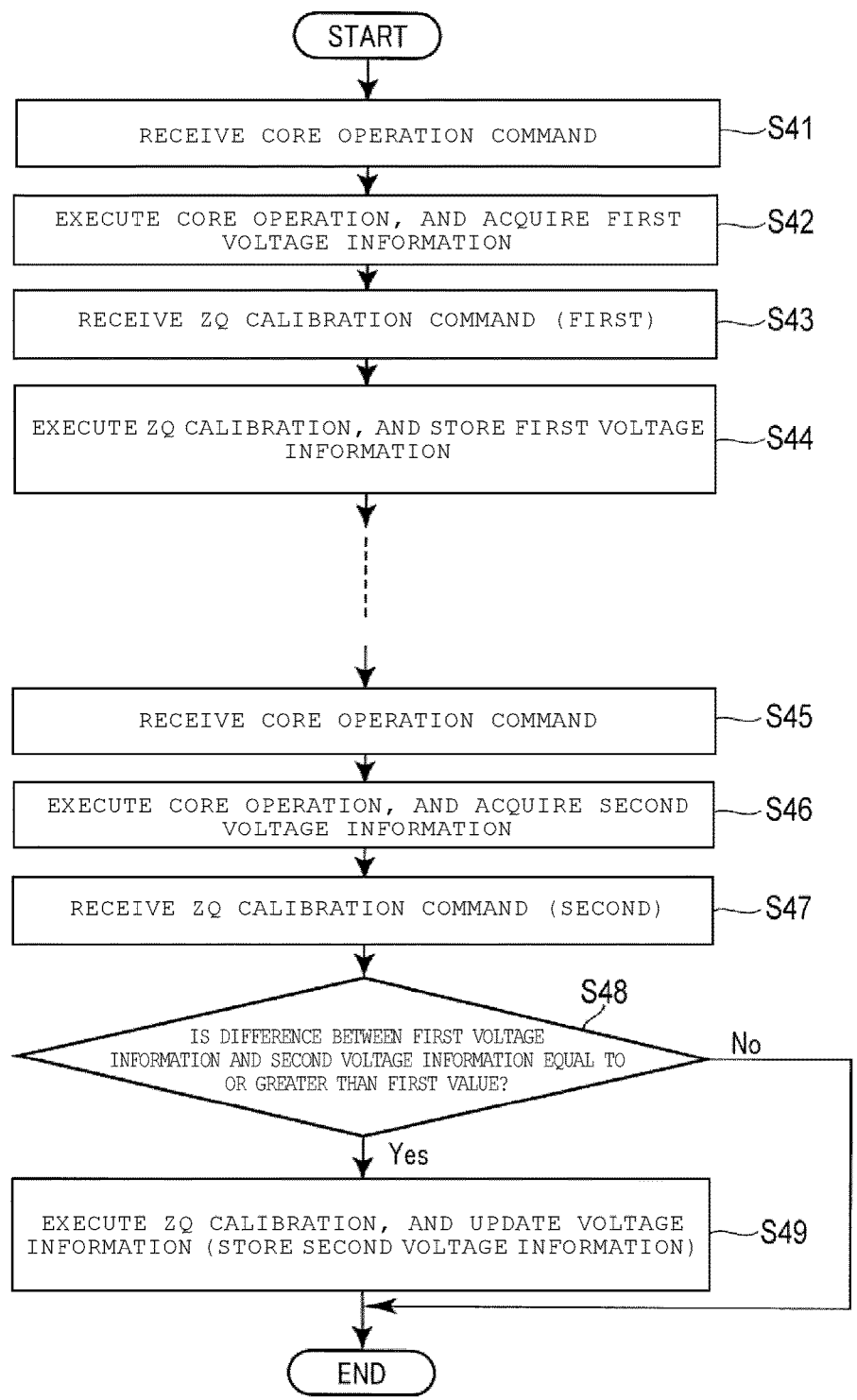
FIG. 21 is a flowchart illustrating a ZQ calibration sequence executed in the semiconductor memory device according to a fourth embodiment.

FIG. 21 is a flowchart illustrating a ZQ calibration sequence in a semiconductor memory device 400 according to the fourth embodiment.

As illustrated in FIG. 21, first, in step S41, a core operation command is received from the external controller 300 by the input/output circuit 11.

Next, in step S42, a core operation is executed on the memory cell array 10. Further, the voltage that is applied to the input/output circuit 11 is measured by the voltage measurement circuit 24, and the measured voltage is acquired as the first voltage information.

Next, in step S43, a first (initial) ZQ calibration command is received from the external controller 300 by the input/output circuit 11.

Next, in step S44, the calibration for the input/output circuit 11 is executed by the ZQ calibration execution circuit 21. Further, the first voltage information acquired by the voltage measurement circuit 24 is stored in the voltage storage circuit 25. Then, various operations are executed.

Next, in step S45, a core operation command is received again from the external controller 300 by the input/output circuit 11.

Next, in step S46, a core operation is executed on the memory cell array 10. Further, the voltage of the input/output circuit 11 is measured by the voltage measurement circuit 24, and the measured voltage is acquired as the second voltage information.

Next, in step S47, a second ZQ calibration command is received from the external controller 300 by the input/output circuit 11.

Next, in step S48, the first voltage information stored in the voltage storage circuit 25 and the second voltage information acquired by the voltage measurement circuit 24 are compared with each other by the ZQ calibration execution circuit 21. More specifically, it is determined whether or not the difference between the first voltage information and the second voltage information is equal to or greater than the first value.

In a case where, in step S48, the difference between the first voltage information and the second voltage information is equal to or greater than the first value, in step S49, the calibration for the input/output circuit 11 is executed by the ZQ calibration execution circuit 21. Further, the second voltage information acquired by the voltage measurement circuit 24 is stored in the voltage storage circuit 25. In other words, the voltage information of the voltage storage circuit 25 is updated from the first voltage information to the second voltage information.

On the other hand, in a case where, in step S48, the difference between the first voltage information and the second voltage information is less than the first value, the calibration and the update of the voltage information are not executed.

Effects According to Fourth Embodiment

In the fourth embodiment, the ZQ calibration control circuit 20 acquires the voltage information at the time of the core operation just before the calibration, and compares the acquired voltage information and the voltage information at the time of the core operation just before the previous calibration. Therefore, there is no need to acquire the voltage information according to the ZQ calibration command, and thus it is possible to reduce the operations according to the ZQ calibration command compared to those of the third embodiment. As a result, it is possible to obtain the same effects as those of the second embodiment.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor memory device comprising:
a first circuit configured to process data received from and transmitted to an external controller;
a second circuit configured to execute calibration on the first circuit; and
a control circuit configured to control the second circuit to execute the calibration on the first circuit in response to a calibration command received from the external controller, wherein
in response to a first calibration command, the control circuit controls the second circuit to execute the calibration on the first circuit, and
in response to a second calibration command that is received after the first calibration command, the control circuit controls the second circuit to execute the calibration on the first circuit if a first condition is met and to not execute the calibration on the first circuit if the first condition is not met, and
a command sequence for the first calibration command received from the controller and a command sequence for the second calibration command received from the controller are different.

2. The device according to claim 1, wherein the first condition is met when a change in a temperature of the first circuit exceeds a threshold.

3. The device according to claim 2, wherein the second circuit includes a temperature measurement circuit that measures a first temperature of the first circuit at a time of the first calibration command and a second temperature of the first circuit at a time of the second calibration command, and the change is equal to a difference in the first and second measured temperatures.

4. The device according to claim 2, wherein the second circuit includes a temperature measurement circuit that measures a first temperature of the first circuit during a first core operation prior to the first calibration command and a second temperature of the first circuit during a second core operation after the first calibration command and prior to the second calibration command, and the change is equal to a difference in the first and second measured temperatures.

5. The device according to claim 1, wherein the first condition is met when a change in a voltage applied to the first circuit exceeds a threshold.

6. The device according to claim 5, wherein the second circuit includes a voltage measurement circuit that measures a first voltage applied to the first circuit at a time of the first calibration command and a second voltage applied to the first circuit at a time of the second calibration command, and the change is equal to a difference in the first and second measured voltages.

7. The device according to claim 5, wherein the second circuit includes a voltage measurement circuit that measures a first voltage applied to the first circuit during a first core operation prior to the first calibration command and a second voltage applied to the first circuit during a second core operation after the first calibration command and prior to the second calibration command, and the change is equal to a difference in the first and second measured voltages.

8. The device according to claim 1, wherein the second circuit is configured to calibrate an impedance of the first circuit.

9. A semiconductor memory device comprising:
a first circuit configured to process data received from and transmitted to an external controller;
a second circuit configured to execute calibration on the first circuit; and
a control circuit configured to control the second circuit to execute the calibration on the first circuit in response to a calibration command received from the external controller, wherein
in response to a first calibration command, the control circuit controls the second circuit to execute the calibration on the first circuit, and
in response to a second calibration command that is received after the first calibration command, the control circuit controls the second circuit to execute the calibration on the first circuit if a first condition is met and to not execute the calibration on the first circuit if the first condition is not met, and
a command sequence for the first calibration command received from the controller and a command sequence for the second calibration command received from the controller are the same.

10. A method of managing calibrations executed on an input/output circuit of a semiconductor memory device that performs operations therein in response to commands received from a controller, said method comprising:
executing a first calibration on the input/output circuit in response to a first calibration command received from the controller;
in response to a second calibration command that is received after the first calibration command, determining if a first condition is met; and
executing a second calibration on the input/output circuit if the first condition is met but not executing the second calibration on the input/output circuit if the first condition is not met, wherein
a command sequence for the first calibration command received from the controller and a command sequence for the second calibration command received from the controller are different.

11. The method according to claim 10, wherein the first condition is met when a change in a temperature of the input/output circuit exceeds a threshold.

12. The method according to claim 11, further comprising:
measuring a first temperature of the input/output circuit at a time of the first calibration command and a second temperature of the input/output circuit at a time of the second calibration command, wherein the change is equal to a difference in the first and second measured temperatures.

13. The method according to claim 11, further comprising:
measuring a first temperature of the first circuit during a first core operation that is executed prior to receipt of the first calibration command and a second temperature of the first circuit during a second core operation executed after receipt of the first calibration command and prior to receipt of the second calibration command, and the change is equal to a difference in the first and second measured temperatures.

14. The method according to claim 10, wherein the first condition is met when a change in a voltage applied to the first circuit exceeds a threshold.

15. The method according to claim 14, further comprising:
measuring a first voltage applied to the first circuit at a time of the first calibration command and a second voltage applied to the first circuit at a time of the second calibration command, wherein the change is equal to a difference in the first and second measured voltages.

16. The method according to claim 14, further comprising:
measuring a first voltage applied to the first circuit during a first core operation executed prior to receipt of the first calibration command and a second voltage applied to the first circuit during a second core operation executed after receipt of the first calibration command and prior to receipt of the second calibration command, wherein the change is equal to a difference in the first and second measured voltages.

17. The method according to claim 10, wherein the calibrations are executed on the input/output circuit to calibrate an impedance of the input/output circuit.

18. A method of managing calibrations executed on an input/output circuit of a semiconductor memory device that performs operations therein in response to commands received from a controller, said method comprising:
executing a first calibration on the input/output circuit in response to a first calibration command received from the controller;
in response to a second calibration command that is received after the first calibration command, determining if a first condition is met; and
executing a second calibration on the input/output circuit if the first condition is met but not executing the second calibration on the input/output circuit if the first condition is not met, wherein
a command sequence for the first calibration command received from the controller and a command sequence for the second calibration command received from the controller are the same.

* * * * *